(12) United States Patent
Okuda et al.

(10) Patent No.: US 8,147,911 B2
(45) Date of Patent: *Apr. 3, 2012

(54) PERFORATED POROUS RESIN BASE MATERIAL AND PRODUCTION PROCESS OF POROUS RESIN BASE WITH INNER WALL SURFACES OF PERFORATIONS MADE CONDUCTIVE.

(75) Inventors: Yasuhiro Okuda, Osaka (JP); Fumihiro Hayashi, Osaka (JP); Tsuyoshi Haga, Osaka (JP); Taro Fujita, Osaka (JP); Mayo Uenoyama, Osaka (JP); Yasuhito Masuda, Osaka (JP); Yuichi Idomoto, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1522 days.

This patent is subject to a terminal disclaimer.

(21) Appl. No.: 10/559,580

(22) PCT Filed: Jun. 4, 2004

(86) PCT No.: PCT/JP2004/008145
§ 371 (c)(1),
(2), (4) Date: Dec. 5, 2005

(87) PCT Pub. No.: WO2004/108332
PCT Pub. Date: Dec. 16, 2004

(65) Prior Publication Data
US 2006/0141159 A1  Jun. 29, 2006

(30) Foreign Application Priority Data
Jun. 6, 2003 (JP) .................... 2003-161635
Jul. 16, 2003 (JP) .................... 2003-275443

(51) Int. Cl.
*B05D 1/32* (2006.01)
*B05D 3/00* (2006.01)
*B05D 5/00* (2006.01)
*H01K 3/10* (2006.01)

(52) U.S. Cl. ........ 427/272; 427/271; 427/256; 427/270; 427/264; 427/331; 427/96.1; 29/853

(58) Field of Classification Search .................. 427/256, 427/331, 96.1; 429/118
See application file for complete search history.

(56) References Cited

U.S. PATENT DOCUMENTS
2,164,764 A * 7/1939 Claypoole ........................ 205/73
(Continued)

FOREIGN PATENT DOCUMENTS
JP    61-281088 A    12/1986
(Continued)

OTHER PUBLICATIONS

Miura Abstract: "The influence of node-fibril morphology on healing of high-porosity expanded polyetrafluoroethylene grafts", 2002 ESR, vol. 34 No. 3.*

(Continued)

Primary Examiner — Timothy Meeks
Assistant Examiner — Mandy Louie
(74) Attorney, Agent, or Firm — McDermott Will & Emery LLP

(57) ABSTRACT

A production process of a perforated porous resin base, comprising Step 1 of impregnating the porous structure of a porous resin base with a liquid or solution; Step 2 of forming a solid substance from the liquid or solution impregnated; Step 3 of forming a plurality of perforations extending through from the first surface of the porous resin base having the solid substance within the porous structure to the second surface in the porous resin base; and Step 4 of melting or dissolving the solid substance to remove it from the interior of the porous structure, and a production process of a porous resin base with the inner wall surfaces of the perforations made conductive, comprising the step of selectively applying a catalyst only to the inner wall surfaces of the perforations to apply a conductive metal to the inner wall surfaces.

22 Claims, 4 Drawing Sheets

U.S. PATENT DOCUMENTS

| | | | |
|---|---|---|---|
| 3,483,283 A * | 12/1969 | Kazuo et al. | 264/49 |
| 3,791,939 A * | 2/1974 | Ferrara et al. | 205/118 |
| 3,799,816 A * | 3/1974 | Schneble | 216/18 |
| 3,859,139 A * | 1/1975 | Dews et al. | 429/41 |
| 4,533,445 A * | 8/1985 | Orio | 522/83 |
| 4,596,577 A | 6/1986 | Sato | |
| 4,978,452 A * | 12/1990 | Aubrey | 210/510.1 |
| 5,128,207 A * | 7/1992 | Formanek et al. | 428/339 |
| 5,753,358 A * | 5/1998 | Korleski | 428/308.4 |
| 5,785,787 A | 7/1998 | Wojnarowski et al. | |
| 5,833,759 A | 11/1998 | Haslow et al. | |
| 5,858,505 A | 1/1999 | Moen et al. | |
| 5,946,556 A * | 8/1999 | Hashizume | 438/126 |
| 6,498,114 B1 * | 12/2002 | Amundson et al. | 438/780 |
| 2002/0029906 A1 * | 3/2002 | Echigo et al. | 174/265 |
| 2002/0040522 A1 * | 4/2002 | Ohya et al. | 29/846 |
| 2003/0022102 A1 * | 1/2003 | Hiraoka et al. | 430/270.1 |

FOREIGN PATENT DOCUMENTS

| | | |
|---|---|---|
| JP | 02-049385 A | 2/1990 |
| JP | 04-242010 A | 8/1992 |
| JP | 05-160567 A | 6/1993 |
| JP | 07-009290 A | 1/1995 |
| JP | 07-142870 A | 6/1995 |
| JP | 08-506777 A | 7/1996 |
| JP | 09-320667 A | 12/1997 |
| JP | 2003-022849 A | 1/2003 |
| JP | 2003-059611 * | 2/2003 |
| JP | 2004-265844 A | 9/2004 |
| WO | WO 94/19170 | 9/1994 |

OTHER PUBLICATIONS

Weege "Basic impregnation techniques" Electrical Insulation Conference 1997 Epoxylite Corp.*

"Electronics Jisso Gijutsu Koza (Elementary Course of Mounting Techniques in Electronics), vol. 1, Introduction" Edited by Association of Hybrid Microelectronics, Kogyo Chosakai Shuppan, Jul. 7, 1998, pp. 203-209.

"Maikuro Kako Gijutsu (Microworking Techniques)" Edited by The Editorial Committee of Microworking Techniques, The Nikkan Kogyo Shinbun, Ltd., Sep. 30, 1988, pp. 8-13 and 168-175.

European Search Report issued in European Patent Application No. EP 04736126.6-1235 dated Feb. 5, 2009.

* cited by examiner

PERFORATED POROUS RESIN BASE MATERIAL AND PRODUCTION PROCESS OF POROUS RESIN BASE WITH INNER WALL SURFACES OF PERFORATIONS MADE CONDUCTIVE.

RELATED APPLICATION

This application is the U.S. National Phase under 35 U.S.C. §371 of International Application No. PCT/JP2004/008145, filed Jun. 4, 2004, which in turn claims the benefit of Japanese Application No. 2003-161635, filed Jun. 6, 2003, and Japanese Application No. 2003-275443, filed Jul. 16, 2003, the disclosures of which Applications are incorporated by reference herein in their entirety.

TECHNICAL FIELD

The present invention relates to a production process of a porous resin base (hereinafter may also be referred to as "porous synthetic resin base") perforated through the thickness of a porous resin material. The present invention also relates to a production process of a porous resin base with the inner wall surfaces of the perforations selectively made conductive.

The perforated porous resin base obtained by the production process according to the present invention can be utilized in a wide variety of fields of, for example, materials for connection between circuits, anisotropically conductive materials and insulating materials in an electronic field; medical devices such as patch repairing materials in a medical field; and separation membranes.

The porous resin base with the inner wall surfaces of the perforations made conductive, which is obtained by the production process according to the present invention, can be used in, for example, electrical connection between circuit devices in semiconductor devices; and tests for electrical reliability, which are carried out in circuit boards, semiconductor wafers and semiconductor packages.

The porous resin bases have various forms including a sheet, a tube and a block and are preferably in the form of a sheet. In the present invention, a porous resin sheet means not only a sheet having a thickness of 0.25 mm or greater, but also a film having a thickness smaller than 0.25 mm.

BACKGROUND ART

In a field of electronics, for example, phenol resins, epoxy resins, glass epoxy resins, polyimide resins, polyester resins, polysulfone resins and polytetrafluoroethylene resins have heretofore been used as resin substrates from the viewpoints of mechanical strength, electrical properties, heat resistance and the like (for example, "ELECTRONICS JISSO GIJUTSU KOZA (Elementary Course of Mounting Techniques in Electronics), Vol. 1, Introduction", edited by Association of Hybrid Microelectronics, Kogyo Chosakai Shuppan, issued on Jul. 1, 1998, Chapter 4, pp. 203-209).

In recent years, with the use of still higher frequency and speeding-up in the field of electronics, particularly, a lower dielectric constant has been required as material properties required of substrates. Attention has been attracted to porous resins as materials for resin substrates because they are low in dielectric constant compared with ordinary non-porous resin materials.

A material for connection between circuits or an anisotropically conductive material has a structure that perforations (hereinafter may also be referred to as "through-holes") are provided in necessary portions of a substrate, and inner wall surfaces of the perforations are covered with a conductive material. In order to use a porous resin material as a material for these substrates, it is thus necessary to form perforations greater than the pore diameter of the porous resin material.

In general, methods for providing perforations (throughholes) in a substrate include machine-working methods, for example, punching by a punch and a die, blanking by a die, and perforating by a drill (for example, "MAIKURO KAKO GIJUTSU (Microworking Techniques)", edited by the Editorial Committee of Microworking Techniques, The Nikkan Kogyo Shinbun, LTD., issued on Sep. 30, 1988, Chapter 1, pp. 8-13, Chapter 2, pp. 168-175). A method of perforating by ultrasonically vibrating the tip of a tool, a chemical etching method, in which a chemical corroding action is utilized to perforate, and a light-abrasion method, in which laser beams are irradiated to perforate, are also known as perforating methods.

When a porous resin material (hereinafter referred to as "porous resin base") formed in the shape of a substrate is perforated by a machine-working method, however, the base itself is deformed, the porous structure of edges and inner wall surfaces of perforations is collapsed, and burr occurs on opening portions of the perforations, so that it is extremely difficult to form perforations with high precision while retaining the porous structure. Even when the method of perforating by ultrasonically vibrating the tip of a tool is applied to the porous resin base, it is difficult to form perforations with high precision.

When the porous resin base is perforated by irradiation of laser beams, peripheries of perforated portions are melted and deformed by heat, or the porous structure of edges and inner wall surfaces of perforations is collapsed. The chemical etching method permits a porous resin base to be perforated according to the kind of the resin forming the porous resin base. However, this method is unsuitable for a method for perforating a porous resin base composed of a corrosion-resistant resin. The porous resin base has a possibility that it may be perforated by irradiation of short-wavelength laser beams such as excimer laser. However, it takes a long time to work it, and so the cost thereof is expensive.

When the porous structure of edges and inner wall surfaces of the perforations in the porous resin base is collapsed, the properties characteristic of the porous resin material are impaired. The porous resin base has elasticity in a thickness-wise direction thereof. When the porous structure about the perforations is collapsed, however, the perforated portions are collapsed by only applying a compressive load to the porous resin base once to lose the elasticity.

When the porous resin base perforated is used as a material for connection between circuits or an anisotropically conductive material, it is necessary to make the inner wall surfaces of the perforations in a thickness-wise direction conductive by applying a conductive metal such as plating particles to them. When the porous structure about the perforated portions is collapsed, however, it is difficult to apply a plating catalyst. In addition, when the porous structure about the perforated portions is collapsed, the elasticity of the conductive portions is impaired even when the inner wall surfaces of the perforations are made conductive, so that the conductive portions themselves are collapsed when a compressive load is applied.

Further, even when the porous resin base is perforated, it is extremely difficult to selectively apply a conductive metal only to the inner wall surfaces of the perforations by a subsequent secondary working to make them conductive. As described above, it is difficult to precisely perforate the porous resin base, and the secondary working subsequent to the perforating is also difficult. These problems are specifically described taking an anisotropically conductive sheet (hereinafter may also be referred to as "anisotropically conductive film") as an example.

In the field of electronics such as semiconductor devices, an anisotropically conductive sheet capable of imparting conductivity only to a thickness-wise direction thereof is used as a means for compactly conducting electrical connection between circuit devices. For example, the anisotropically conductive sheet is widely used for compactly conducting the electrical connection between circuit devices without using a means such as soldering.

There has also been proposed a method of interposing an anisotropically conductive sheet between electrodes to be inspected and electrodes of an inspection apparatus for the purpose of achieving electrical connection between the electrodes to be inspected formed on one surface of a circuit board, which is an object of inspection, and the electrodes of the inspection apparatus. This anisotropically conductive sheet preferably has elasticity in the thickness-wise direction thereof for the purpose of achieving the electrical connection between the electrodes to be inspected and the electrodes of the inspection apparatus without damaging the electrodes to be inspected and by absorbing variations of height among the electrodes to be inspected.

As specific examples of the anisotropically conductive sheet, there has been proposed, for example, an anisotropically conductive material for connection obtained by dispersing conductive particles in a binder composed of an epoxy resin to form a sheet (for example, Japanese Patent Application Laid-Open No. 4-242010). This anisotropically conductive material for connection is so constructed that when the conductive material is pressed between terminals opposed to each other, the conductive particles come into contact with the respective terminals only at compressed portions to conduct only in a thickness-wise direction between the terminals. The dispersed state of the conductive particles is controlled, thereby retaining the insulating property in a lateral direction of the sheet.

There have also been known anisotropically conductive sheets obtained by forming a great number of through-holes in a sheet formed from a polymeric material and filling a conductive material into the respective through-holes to make only specified portions of the sheet in a thickness-wise direction thereof conductive. There have been proposed, for example, anisotropically conductive sheets obtained by filling an insulating elastic polymeric substance, in which conductive particles have been dispersed, into each of a plurality of through-holes provided in an insulating plate formed from a resin material or a composite resin material reinforced with glass fiber and having stiffness to provide conductive path-forming devices (for example, Japanese Patent Application Laid-Open No. 9-320667).

There have been proposed electrically connecting members obtained by forming a great number of through-holes in an electrically insulating polymeric film and filling a metal into the respective through-holes to make the film conductive only in a thickness-wise direction of the film (for example, Japanese Patent Application Laid-Open No. 2-49385), and elastic connectors obtained by arranging a conductive member within a plurality of through-holes formed in a thickness-wise direction of an elastic sheet member subjected to a foaming treatment (for example, Japanese Patent Application Laid-Open No. 2003-22849).

In the anisotropically conductive sheets having the structure that the conductive material is filled into the respective through-holes in the sheet formed from the polymeric material, as a method for forming the through-holes (perforations), is adopted, for example, an etching method making use of a light source such as a laser, or a machine-working method such as pressing, punching or drilling. According to the etching method, small through-holes having a hole diameter of at most 100 μm, further at most 50 μm can be generally formed. However, this method is expensive in working cost. The machine-working method is generally used in the case where relatively large through-holes having a hole diameter of at least 100 μm are formed and has a feature that it is cheap in working cost.

On the other hand, the anisotropically conductive sheet desirably has sufficient elasticity to achieve connection between electrodes to be connected or electrodes to be inspected without damaging them and absorb variations of height among electrodes to be inspected to achieve good electrical connection. An anisotropically conductive sheet having elasticity in a thickness-wise direction thereof and permitting conduction in the thickness-wise direction under a low compressive load can be used repeatedly in inspection of electrical conduction because it has elastic recovery property in addition to the fact that it scarcely damages the electrodes to be inspected.

The anisotropically conductive sheets, in which an elastomer with the conductive particles dispersed therein or the metal filled into the respective through-holes in the sheet formed from the electrically insulating polymeric material to provide conductive portions (conductive paths), involve such problems that a high compressive load is required for achieving conduction in the thickness-wise direction and that the elasticity at the conductive portions is deteriorated due to deterioration of the elastomer with time or upon use under a high temperature in a burn-in test or the like.

In the state of the art, it has however been difficult even by those skilled in the art to use a porous resin base having elasticity in a thickness-wise direction thereof to form perforations with high precision without collapsing the porous structure and further to subject the porous resin base to a secondary working such as selective application of a conductive metal to inner wall surfaces of the perforations.

On the other hand, in a medical field, an expanded porous polytetrafluoroethylene (hereinafter abbreviated as "expanded PTFE") is used in artificial blood vessels and medical devices such as patch repairing materials and sutures. The expanded PTFE has highly inert chemical properties and moreover has such properties that the internal growth of vital tissues is allowed by controlling a microstructure that the porous structure is formed. The expanded PTFE is known to facilitate the internal growth of vital tissues by providing microscopic perforations extending through in a thickness-wise direction thereof.

There have heretofore been proposed expanded PTFE sheet materials having a microstructure comprising nodes connected to each other by fibrils and having microscopic pores extending through in a thickness-wise direction thereof (for example, Japanese Patent Application Laid-Open (KOHYO) No. 8-506777 (through PCT route)). In this document, it is described that when an expanded PTFE material subjected to expanding before perforating is perforated by a needle, the perforations have very rough edges appearing to be caused by irregular cutting and deformation of the material. This document also shows that perforating by removing the expanded PTFE using a sharp blade also results in perforations having rough edges. When the expanded PTFE material subjected to the perforating is used as a medical device such as a patch, there is a possibility that some trouble may occur in a vital body when the perforations have rough edges.

Thus, the document (Japanese Patent Application Laid-Open (KOHYO) No. 8-506777 (through PCT route)) has proposed a method that the expanded PTFE material is not perforated, but an extruded product before expanding is perforated and then expanded. More specifically, this document discloses a process for producing an expanded PTFE material having a microstructure comprising nodes connected to each other by fibrils and microscopically perforated, which comprises extruding a billet preliminary formed from a mixture of PTFE and a liquid lubricant to produce an extruded product, removing the liquid lubricant from the extruded product, forming microscopic pores extending through in a thickness-wise direction of the extruded product and then uniaxially or biaxially expanding the extruded product. This document describes that when the extruded product before expanding is perforated and then expanded, an expanded PTFE material having perforations with substantially smooth edges is obtained.

According to the process described in the document (Japanese Patent Application Laid-Open (KOHYO) No. 8-506777 (through PCT route)), the extruded product before expanding is perforated and then expanded, thereby smoothening rough edges caused by the perforating. However, this process is insufficient to form perforations having edges highly smoothened. In addition, according to the process described in this document, the extruded product is perforated and then uniaxially or biaxially expanded to form a porous structure. It is thus difficult to control the positions and diameter of the perforations with high precision.

A perforated porous resin base used as a substrate of a material for connection between circuits or an anisotropically conductive material is required to preset the positions and diameter of a plurality of perforations with high precision. Unless the positions of the perforations can be controlled with high precision, electrical connection between circuit devices or electrical connection between electrodes to be inspected of a circuit board and electrodes of an inspection apparatus cannot be precisely carried out by means of such a porous resin base even when a conductive metal is applied to the inner wall surfaces of the perforations to make them conductive.

Further, according to the process described in the above-described document, an expanded PTFE material having perforations can be produced, but the process cannot be applied to selective application of the conductive metal to the inner wall surfaces of the perforations to make them conductive.

DISCLOSURE OF THE INVENTION

A porous resin material having electrically insulating property, a low dielectric constant and elasticity is suitable for use as a resin base of materials for connection between circuits, anisotropically conductive materials or the like. In order to use a porous resin base to produce a material for connection between circuits or an anisotropically conductive material, it is necessary to form through-holes (perforations) having sharp edges at necessary positions of the base without collapsing the porous structure thereof and causing deformation or producing burr.

Regarding this, description is given taking an anisotropically conductive sheet as an example. As described above, the anisotropically conductive sheet desirably has sufficient elasticity for the purpose of achieving good electrical connection without damaging electrodes to be connected and electrodes to be inspected and by absorbing variations of height among the electrodes to be inspected. The present inventors thus developed an anisotropically conductive sheet of the structure that an electrically insulating porous resin sheet is used as a base film, through-holes are provided at a plurality of positions of the base film, and a conductive metal is applied to the wall surfaces of the through-holes and previously proposed (see Japanese Patent Application No. 2003-096173).

An electrically insulating, elastic and porous resin sheet is suitable for use as the base film of the anisotropically conductive sheet. When a process of applying a conductive metal to the inner wall surfaces of a plurality of through-holes provided in a porous resin sheet to form conductive portions is adopted in place of the process of filling a conductive material such as an elastomer, in which conductive particles have been dispersed, or a metal into respective through-holes in a sheet formed from a polymeric material, there can be provided an anisotropically conductive sheet which permits conduction in a thickness-wise direction thereof under a low compressive load in addition to excellent elasticity in the thickness-wise direction, and moreover can be used repeatedly in inspection of electrical conduction because the conductive portions can be restored to their original form by elastic recovery.

As a method for applying the conductive metal to the wall surfaces of the respective through-holes in the porous resin sheet, an electroless plating method is suitable. In order to deposit conductive metal particles only on the inner wall surfaces of the through-holes by the electroless plating method to make them conduct, however, it is necessary in a step of applying a catalyst (plating catalyst) facilitating a chemically reducing reaction prior to this plating to mask other portions than the inner wall surfaces of the respective through-holes provided in the porous resin sheet to apply the catalyst only to the inner wall surfaces.

When, for example, a method, in which the same porous resin sheets as the base film are laminated as mask layers on both sides of the base film, through-holes are formed in the resulting laminate, a catalyst facilitating a chemically reducing reaction is applied to the whole surface of the laminate, including the through-holes, the mask layers are then separated, is adopted as a masking method, the catalyst applied to the other portions than the inner wall surfaces of the through-holes can be removed together with the mask layers. When electroless plating is carried out using the catalyst applied to and remaining on the wall surfaces of the respective through-holes after the removal of the mask layers, the conductive metal can be applied only to the inner wall surfaces of the through-holes to form conductive portions (the above-described Japanese Patent Application No. 2003-096173).

When a machine-working method, which is cheap in process cost, is applied to the formation of through-holes as great as at least 100 μm in diameter in a porous resin sheet, however, the porous structure about the through-holes including the inner wall surfaces thereof is collapsed, so that it is difficult to sufficiently apply the conductive metal to the inner wall surfaces of the through-holes by the electroless plating. When the porous structure is collapsed by the perforating, the elasticity of the perforated portions is impaired.

It is an object of the present invention to provide a production process of a perforated porous resin base, by which perforations (through-holes) having smooth edges can be formed at necessary positions of a porous resin base with high precision without incurring collapse of the porous structure, deformation of the base and occurrence of burr.

Another object of the present invention is to provide a production process of a porous resin base made conductive by forming a plurality of perforations (though-holes) in a porous resin base and applying a conductive metal to the inner wall surfaces of the respective perforations to form conductive portions, by which when the perforations are formed by a machine-working method, perforations having smooth edges can be formed with high precision while preventing collapse of the porous structure about the perforated portions, and moreover a plating catalyst facilitating a reducing reaction of a metal ion can be selectively applied to the inner wall surfaces of the respective perforations, thereby surely applying the conductive metal to the inner wall surfaces by electroless plating or the like.

The present inventors have carries out an extensive investigation with a view toward achieving the above objects. As a result, the inventors have conceived of a process comprising impregnating the porous structure of a porous resin base with a liquid or solution, forming a solid substance from the liquid or solution impregnated and forming a plurality of perforations extending through from the first surface of the porous resin base having the solid substance within the porous structure to the second surface in the porous resin base.

According to the production process of the present invention, the perforations can be formed at the necessary positions without collapsing the porous structure even when a mechanical perforating method is adopted. The perforations formed have smooth edges and do not cause defects such as deformation. After the perforating, the solid substance can be removed from the interior of the porous structure by melting or dissolving it. As the liquid or solution impregnated into the porous resin base, may be used any of various substances such as water, alcohols, hydrocarbons and polymers.

It has also been conceived that when the above-described process is applied, a porous resin base with a conductive metal selectively applied to the inner wall surfaces of the perforations can be produced.

It has been found that the porous structure including both surfaces of the porous resin base is impregnated with a soluble polymer or paraffin to form a composite sheet, and solid layers of the soluble polymer or paraffin existing on both surfaces of the porous resin base are used as masking materials, whereby after formation of a plurality of perforations, a catalyst facilitating a reducing reaction of a metal ion can be selectively applied to the inner wall surfaces of the respective perforations.

The soluble polymer or paraffin is impregnated as a liquid (melt) or solution into the interior of the porous structure including both surfaces of the porous resin base. When this process is adopted, the porous structure about the perforated portions including the inner wall surfaces is prevented from being collapsed even when the perforations are formed by a machine-working method. The perforating is carried out at a temperature that the soluble polymer or paraffin impregnated into the porous structure retains its solid state. When a substance that is solid at ordinary temperature (15 to 30° C.) is used as the soluble polymer or paraffin, the perforation can be formed at ordinary temperature. The soluble polymer or paraffin soluble in a solvent can be easily removed by dissolving it in the solvent after using it as the masking material. This process can also be carried out by using a compound capable of forming a solid substance by a chemical reaction, such as a polymerizable monomer, in place of the soluble polymer or paraffin.

The present inventors have further conceived of a process of using a liquid or solution containing a compound capable of forming a solid substance by a chemical reaction as another process for producing the porous resin base with the conductive metal selectively applied to the inner wall surfaces of the perforations.

More specifically, porous resin layers are laminated as mask layers on both surfaces of a porous resin base to form a laminate of a 3-layer structure, the respective porous structures of the laminate are impregnated with a liquid or solution containing a compound capable of forming a solid substance by a chemical reaction, and the compound in the liquid or solution impregnated is subjected to a chemical reaction to form a solid substance.

After a plurality of perforations extending through from the first surface of the laminate having the solid substance within the respective porous structures to the second surface are formed in the laminate, the solid substance is removed. A catalyst facilitating a reducing reaction of a metal ion is applied to the surfaces of the laminate including the inner wall surfaces of the respective perforations. The mask layers are then separated from both surfaces of the porous resin base, and the catalyst applied to and remaining on the inner wall surfaces of the respective perforations in the porous resin base is used to apply the conductive metal to the inner wall surfaces, whereby a porous resin base with the inner wall surfaces of the perforations selectively made conductive can be produced. This process can also be carried out by using the soluble polymer or paraffin in place of the compound capable of forming a solid substance by a chemical reaction. The present invention has been led to completion on the basis of these findings.

According to the present invention, there is thus provided a process for producing a perforated porous resin base, which comprises the following Steps 1 to 4:

(1) Step 1 of impregnating the porous structure of a porous resin base with a liquid or solution;

(2) Step 2 of forming a solid substance from the liquid or solution impregnated;

(3) Step 3 of forming a plurality of perforations extending through from the first surface of the porous resin base having the solid substance within the porous structure to the second surface in the porous resin base; and (4) Step 4 of melting or dissolving the solid substance to remove it from the interior of the porous structure.

According to the present invention, there is also provided a process for producing a porous resin base with the inner wall surfaces of perforations made conductive, which comprises the following Steps I to IV:

(1) Step I of impregnating the porous structure of a porous resin base including both surfaces thereof with a soluble polymer or paraffin, or a compound capable of forming a solid substance by a chemical reaction;

(2) Step II of forming a solid substance from the soluble polymer or paraffin, or the compound capable of forming a solid substance by a chemical reaction, which has been impregnated, to form a composite sheet of a structure that both surfaces of the porous resin base have a layer of the solid substance, and the solid substance is impregnated into the porous structure;

(3) Step III of forming a plurality of perforations extending through from the first surface of the composite sheet to the second surface in the composite sheet;

(4) Step IV of applying a catalyst facilitating a reducing reaction of a metal ion to the surfaces of the composite sheet including the inner wall surfaces of the respective perforations;

(5) Step V of removing the solid substance from the composite sheet; and (6) Step VI of using the catalyst applied to and remaining on the inner wall surfaces of the respective perforations in the porous resin base to apply a conductive metal to the inner wall surfaces.

According to the present invention, there is further provided a process for producing a porous resin base with the inner wall surfaces of perforations made conductive, which comprises the following Steps i to viii:

(1) Step i of laminating, as mask layers, porous resin layers (B) and (C) on both surfaces of a porous resin base (A) to form a laminate of a 3-layer structure;

(2) Step ii of impregnating the respective porous structures of the laminate with a soluble polymer or paraffin, or a compound capable of forming a solid substance by a chemical reaction;

(3) Step iii of forming a solid substance from the soluble polymer or paraffin, or the compound capable of forming a solid substance by a chemical reaction, which has been impregnated;

(4) Step iv of forming a plurality of perforations extending through from the first surface of the laminate having the solid substance within the respective porous structures to the second surface in the laminate;

(5) Step v of dissolving the solid substance to remove it from the interiors of the respective porous structures;

(6) Step vi of applying a catalyst facilitating a reducing reaction of a metal ion to the surfaces of the laminate including the inner wall surfaces of the respective perforations;

(7) Step vii of removing the mask layers from both surfaces of the porous resin base (A); and (8) Step viii of using the catalyst applied to and remaining on the inner wall surfaces of the respective perforations in the porous resin base (A) to apply a conductive metal to the inner wall surfaces.

BEST MODE FOR CARRYING OUT THE INVENTION

1. Porous Resin Base (Base Film)

Figure 1:
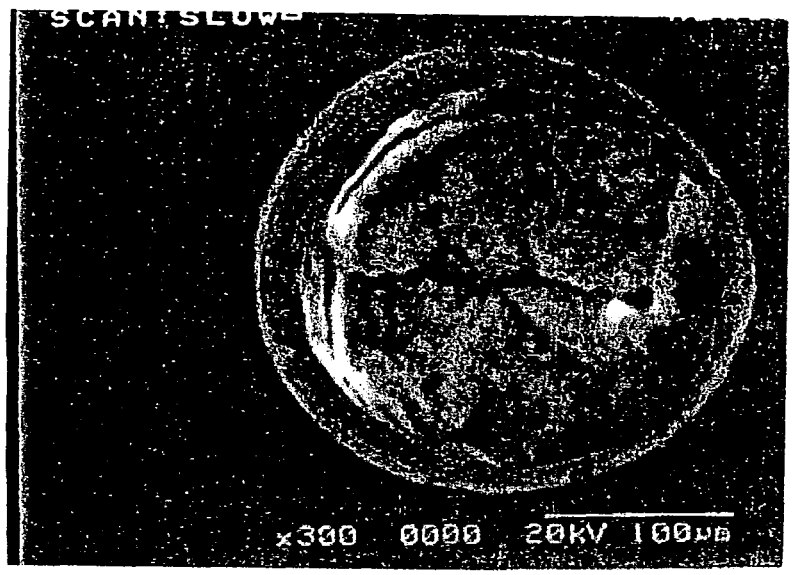
FIG. 1 is an enlarged microphotograph of a perforation formed by a process according to the present invention for producing a perforated porous resin base.

As a resin material for forming a porous resin base used in the present invention, any resin may be used so far as it can form a porous resin. As the porous resin base, that formed from a resin material excellent in heat resistance, workability, mechanical properties, dielectric characteristics and the like is preferably selected for the purpose of withstanding a perforating method adopted in the present invention and application of a conductive metal and suiting uses in a field of electronics and a medical field.

In, for example, an anisotropically conductive sheet used in electrical connection between circuit devices or inspection of electrical conduction, a base (base film) thereof is preferably excellent in heat resistance. In a burn-in test in particular, it is necessary to use the base excellent in heat resistance because accelerated deterioration at a high temperature is conducted in a state that the anisotropically conductive sheet has been interposed between electrodes to be inspected of a circuit device and electrodes of an testing equipment.

The anisotropically conductive sheet is also required to permit it to be made conductive in a thickness-wise direction thereof and have electrically insulating property in a lateral direction (direction perpendicular to the thickness-wise direction) thereof. Accordingly, a synthetic resin forming the porous resin base, which will become a base film, is required to have electrically insulating property. An anisotropically conductive sheet for electrical connection in particular is preferably that making use of a porous resin base formed of a synthetic resin having a low dielectric constant so as not to form the cause that signal delay occurs when a semiconductor device or the like is used by high-frequency signals.

Examples of the synthetic resin forming the porous resin base include fluorocarbon resins such as polytetrafluoroethylene (PTFE), tetrafluoroethylene/hexafluoropropylene copolymers (FEP), tetrafluoroethylene/perfluoroalkylene copolymers (PFA), polyvinylidene fluoride (PVDF), polyvinylidene fluoride copolymers and ethylene/tetrafluoroethylene copolymers (ETFE resins); and engineering plastics such as polyimide (PI), polyamide-imide (PAI), polyamide (PA), modified poly(phenylene ether) (mPPE), poly(phenylene sulfide) (PPS), poly(ether ether ketone) (PEEK), polysulfone (PSU), poly(ether sulfone) (PES) and liquid crystal polymers (LCP).

Among these synthetic resins, fluorocarbon resins are preferred from the viewpoints of heat resistance, chemical resistance, workability, mechanical properties, dielectric characteristics (low dielectric constant) and the like, with PTFE being particularly preferred.

In the production processes according to the present invention, for example, a polymer or paraffin soluble in a solvent is used as a masking material, and a method of dissolving the soluble polymer or paraffin in the solvent to remove it is generally adopted after a catalyst facilitating a reducing reaction of a metal ion is applied, so that the synthetic resin forming the base is preferably insoluble or hardly soluble in used in dissolving the soluble polymer or paraffin. This also corresponds to the case where a solid substance within the porous structure is dissolved in a solvent to remove it in the production process of the perforated porous resin base. A fluorocarbon resin is preferred from the viewpoint of such behavior to the solvents, with PTFE being particularly preferred.

Examples of a method for producing the porous resin base include perforating, phase separation, solvent extraction, expanding and laser irradiation methods. The form of the porous resin base may be suitably preset from a sheet, a tube, a block and the like as necessary for the end application intended. In many cases, however, it is a sheet (including a film). For example, a porous resin sheet is used as a base film, whereby elasticity can be imparted to the resulting anisotropically conductive sheet in a thickness-wise direction thereof, and the dielectric constant thereof can be further reduced.

The porous resin base preferably has a porosity within a range of 20 to 80%. The porous resin base preferably has an average pore diameter of at most 10 μm or a bubble point of at least 2 kPa. From the viewpoint of forming conductive portions at a fine pitch, it is more preferable that the average pore diameter be at most 1 μm, or the bubble point be at least 10 kPa.

The thickness of the porous resin base may be suitably selected according to the purpose of use and a position used. However, it is generally at most 3 mm, preferably at most 1 mm, and the lower limit thereof is generally 5 μm, preferably 10 µm. The thickness of the porous synthetic resin sheet in the case of, for example, an anisotropically conductive sheet for test of electrical conduction is of the order of preferably 5 to 500 µm, more preferably 10 to 200 µm, particularly preferably 15 to 100 µm.

Among porous resin bases, an expanded PTFE sheet produced by an expanding method is an excellent material as a base film for anisotropically conductive sheets because it is excellent in heat resistance, workability, mechanical properties, dielectric characteristics and the like and has an even pore diameter distribution. The expanded PTFE sheet is also suitable for use in medical devices such as patch repairing materials.

The expanded PTFE sheet used in the present invention can be produced in accordance with, for example, the process described in Japanese Patent Publication No. 42-13560. A liquid lubricant is first mixed with unsintered powder of PTFE, and the resultant mixture is extruded into a tube or plate by ram extrusion. When a sheet having a small thickness is desired, the plate-like extruded product is rolled by pressure rolls. After the extrusion and rolling, the liquid lubricant is removed from the extruded product or rolled product as needed.

When the thus-obtained plate-like extruded product or rolled product is uniaxially or biaxially expanded, an unsintered porous PTFE sheet is obtained. When the unsintered porous PTFE sheet is heated to a temperature of at least 327° C. that is a melting point of PTFE while fixing it so as not to cause shrinkage, thereby fixing the ecpanded structure by sintering, an expanded PTFE having high strength is obtained. When a tube-like extruded product is uniaxially expanded and sintered, an expanded PTFE tube is obtained. The expanded PTFE tube can be formed into a sheet by cutting it in a longitudinal direction thereof.

The expanded PTFE sheet has a microstructure (hereinafter also referred to as "micro-fibrous tissue") comprising a great number of very fine fibrils and a great number of nodes connected to each other by the fibrils. In the expanded PTFE sheet, this microstructure forms a porous structure. Accordingly, in the expanded PTFE sheet, a resin portion of the porous structure is composed of the fibrils and nodes, while the interior (hereinafter also referred to as "void portion" or "pore portion") of the porous structure is composed of spaces formed by the fibrils and nodes. The expanded PTFE sheet is excellent in elasticity in a thickness-wise direction thereof and also excellent in elastic recovery property.

2. Impregnating Liquid or Solution (Impregnating Substance)

In the present invention, the porous structure of the porous resin base is impregnated with a liquid or solution prior to perforating. This liquid or solution is that capable of forming a solid substance. This solid substance can be melted or dissolved. In the present invention, an impregnating substance is called a liquid or solution. However, it is represented by a state upon the impregnation. Accordingly, such substances also include those in a solid state at ordinary temperature.

The liquid or solution is only required to be in the form of a liquid or solution at the time it is impregnated into the porous structure of the porous resin base. For example, a substance having a high solidifying point or melting point and being in a solid state at ordinary temperature (15 to 30° C.) is only required to be impregnated into the porous structure of the porous resin base after it is heated into a liquid (melt). After the impregnation, it is cooled to a temperature of its solidifying point or melting point or lower to solidify it.

A substance in a solid state at ordinary temperature is cooled to a temperature of its solidifying point or melting point or lower to solidify it. The solution is only required to vaporize out a solvent after the impregnation to deposit a solute in a solid state. In a substance capable of forming a solid substance by a chemical reaction, such as a polymerizable monomer, it is impregnated in the form of a liquid or solution, and a solid substance such as a solid polymer is then formed by a chemical reaction such as a polymerization reaction.

The removal of the solid substance from the interior of the porous structure is carried out by heating the porous resin base to a temperature exceeding the solidifying point or melting point of the solid substance to melt it, thereby removing it as a liquid or by dissolving it with a solvent, thereby removing it as a solution. The removing method with the solvent may be called extraction.

When the liquid is that solidified by solidification or cooling, the solidifying point or melting point thereof is preferably $-150$ to $150°$ C., more preferably $-80$ to $100°$ C. If the solidifying point or melting point is too low, the cost of a cooling means for solidification becomes expensive. If the solidifying point or melting point is too high, the temperature comes near to the softening point or decomposition point of the porous resin base, so that there is a possibility deterioration of the porous resin base may be accelerated. In addition, if the solidifying point or melting point is too high, such a substance becomes highly viscous even when it is heated into a liquid, so that it is required to conduct vacuumization upon the impregnation to make the process complicated.

The liquid (substance) solidified by solidification or cooling may be any liquid so far as it can be solidified at a temperature not higher than the softening point or decomposition point of the porous resin base used, and preferably has a solidifying point or melting point within the above-described range. Examples of such a liquid (substance) include water, alcohols, hydrocarbons, polymers and mixtures of two or more substances thereof.

More specifically, examples of the impregnating liquid (substance) include water; alcohols such as methanol, ethanol, 1-propanol, 2-propanol, 1-butanol, 2-butanol, 2-methyl-1-propanol, 2-methyl-2-propanol, 1-pentanol, cyclohexanol, 1-methylcyclohexanol, 2-methylcyclohexanol, 1,2-ethanediol, 1,2-propanediol, 1,3-propanediol, 1,4-butanediol, 2,3-butanediol, 1,5-pentanediol, glycerol and 2-ethyl-(hydroxymethyl)-1,3-propanediol; and hydrocarbons such as butane, pentane, n-hexane, 2,2-dimethylbutane, 2,3-dimethylbutane, heptane, n-octane, 2,2,3-trimethylpentane, isooctane, n-nonane, n-decane, n-dodecane, toluene, o-xylene, m-xylene, p-xylene, naphthalene, cyclopentane and cyclohexane.

As the impregnating liquid (substance), may also be used polymers in a liquid state at ordinary temperature, low-melting polymers in a solid state at ordinary temperature, high-melting paraffins (alkanes; a sort of hydrocarbons) in a solid state at ordinary temperature, or the like. These polymers and paraffins may also be used in the form of a solution.

When a substance in a solid state at ordinary temperature is used as a solution, a solvent that can dissolve the substance in a solid state at ordinary temperature, such as a polymer, paraffin or naphthalene, and does not dissolve or hardly dissolves the porous resin base is selected as a solvent. The solvent preferably does not corrode, dissolve and decompose the porous resin base.

The solution is preferably applied to a process in which the solution is impregnated into the porous structure of the porous resin base by casting or dipping, and the solvent is removed, thereby depositing a solid substance that is a solute. After the perforating, it is only necessary to dissolve the solid substance out of the porous structure with the solvent used.

When a soluble polymer or high-melting paraffin is used as the liquid or solution, the soluble polymer or paraffin can be used as a masking material upon making the inner wall surfaces of the perforations conductive, in addition to the fact that perforating can be performed with high precision.

In the first process according to the present invention for producing a porous resin base with the inner wall surfaces of perforations made conductive, for example, a polymer material soluble in solvents or a paraffin in a solid state at ordinary temperature is used as a masking material. No particular limitation is imposed on the soluble polymer so far as it is soluble in a solvent such as water or an organic solvent. However, it is preferably a polymer that has excellent affinity to the porous resin base, can be easily impregnated into the porous structure of the porous resin base.

The soluble polymer is such a polymer that the solvent dissolving the soluble polymer can be easily penetrated into the porous structure of the porous resin base. The soluble polymer is preferably solid at ordinary temperature (15 to 30° C.) in that perforations (through-holes) can be easily formed at ordinary temperature by a mechanical perforating method.

For example, when a porous fluorocarbon resin sheet such as an expanded PTFE sheet is used as the porous resin base, an acrylic resin is preferred as the soluble polymer. As examples of the acrylic resin, may be mentioned homopolymers of alkyl esters of acrylic acid (i.e., acrylate) or alkyl esters of methacrylic acid (i.e., methacrylates), such as polymethyl methacrylate (PMMA), and copolymers thereof.

As examples of the alkyl esters of acrylic acid and the alkyl esters of methacrylic acid, may be mentioned acrylates such as methyl acrylate, ethyl acrylate, isopropyl acrylate, n-butyl acrylate, t-butyl acrylate, 2-ethylhexyl acrylate, n-octyl acrylate, isooctyl acrylate, isononyl acrylate, decyl acrylate and dodecyl acrylate; and methacrylates such as methyl methacrylate, ethyl methacrylate, isopropyl methacrylate, n-butyl methacrylate, t-butyl methacrylate, 2-ethylhexyl methacrylate, n-octyl methacrylate, isooctyl methacrylate, isononyl methacrylate, decyl methacrylate, dodecyl methacrylate, cyclohexyl methacrylate, benzyl methacrylate and isobornyl methacrylate.

The soluble polymer may be an acrylic resin obtained by copolymerizing an alkyl ester of (meth)acrylic acid with another vinyl monomer copolymerizable therewith. As examples of another vinyl monomer, may be mentioned carboxyl group-containing monomers such as acrylic acid, methacrylic acid, maleic acid, maleic anhydride and itaconic acid; (meth)acrylamide and derivatives thereof, such as acrylamide, methacrylamide and N-methylol-acrylamide; epoxy group-containing monomers such as glycidyl(meth)acrylate; unsaturated nitriles such as acrylonitrile and methacrylonitrile; and vinyl aromatic compounds such as styrene and p-methylstyrene. Another vinyl monomer is used in a copolymerization proportion of generally at most 30% by weight, preferably at most 20% by weight.

In the present invention, a paraffin (i.e., alkane) may be used as a masking material. As the paraffin, is preferably a paraffin in a solid state at ordinary temperature from the viewpoint of easy formation of through-holes at ordinary temperature. The melting point of the paraffin is preferably at least 15° C., more preferably at least 20° C., particularly preferably at least 25° C. If the melting point of the paraffin is too low, it is necessary to lower the temperature of a working environment or cool the composite sheet upon formation of perforations by a machine-working method, so that such a paraffin is not desirable from the viewpoint of energy cost.

As specific examples of the paraffin, may be mentioned hexadecane, heptadecane, octadecane, nonadecane, icosane, henicosane, docosane, triacontane and heptacontane. These paraffins may be used either singly or in any combination thereof. The paraffin may be a mixture of two or more compounds thereof. In such a case, any mixture may be well used so far as the melting point of the mixture is preferably at least 15° C. even when the mixture contains a low-melting alkane. Likewise, the paraffin may contain impurities or the like mixed in upon the synthesis thereof. As the paraffin, may be used a commercially available high-melting paraffin.

As the soluble polymer, is particularly preferred PMMA in that it is excellent in affinity to the porous resin base such as the expanded PTFE, perforations can be easily formed by a machine-working method, it is not separated in a perforation-forming step and a catalyst-applying step, and it can be easily dissolved and removed by a solvent after it is used as the masking material.

In the present invention, as the liquid or solution impregnated into the porous structure of the porous resin base, may be used a liquid of solution containing a compound capable of forming a solid substance by a chemical reaction. As the compound capable of forming a solid substance by a chemical reaction, is typically a polymerizable monomer.

As the polymerizable monomer, is used a monofunctional monomer, preferably a monofunctional monomer having only one acryloyl group or methacryloyl group. When a polyfunctional monomer having a bifunctional or still higher polyfunctional group is used, a crosslinked structure is formed by a polymerization reaction, so that the solid substance formed becomes insoluble or hardly soluble in solvents, and solvent extraction cannot be conducted. It is hence not preferable to use such a polyfunctional monomer.

No particular limitation is imposed on the monofunctional monomer so far as it can form a polymer soluble in solvents after a polymerization reaction. As a specific example of the monofunctional monomer, may be used the acrylate or methacrylate used in forming the above-described soluble polymer. Among these monomers, methyl methacrylate, methyl acrylate, isobonyl acrylate, isobonyl methacrylate and the like are preferred.

Polymers formed from these polymerizable monomers are soluble in organic solvents such as xylene, methyl ethyl ketone and acetone. These polymerizable monomers may be used either singly or in any combination thereof.

The polymerizable monomer is preferably low in viscosity and surface tension in that it can be easily impregnated into the porous structure of the porous resin base. In this respect, methyl methacrylate is particularly preferred. However, even a polymerizable monomer having a high viscosity may be impregnated into the porous resin base by lowering its viscosity by heating upon the impregnation into the porous resin base. A polymerizable monomer having a high surface tension may be impregnated into the porous resin base by lowering its surface tension by addition of a surfactant.

When perforations are formed by machine working, the polymerizable monomer is preferably such that it can form a hard and brittle polymer from the viewpoint of preventing occurrence of burr. The polymer formed preferably has a high glass transition temperature in that it is not softened even when the temperature of worked sites is raised by generation of frictional heat when the perforations are formed by machine working. In this regard, isobonyl methacrylate, which forms a polymer having a glass transition temperature as high as 180° C., is preferred.

When a solution (hereinafter may be referred to as "polymerizable monomer solution") obtained by dissolving a polymer obtained by polymerizing a polymerizable monomer in advance is used in the polymerizable monomer, volume shrinkage occurred at the time the polymerizable monomer has been polymerized can be inhibited, whereby warpage and distortion of the porous resin base can be inhibited, and in turn, the perforations can be formed with good precision. It is hence preferable to use such a polymerizable monomer solution. The concentration of the polymer may be suitably selected within a range that the viscosity of the monomer solution does not become very high. However, it is generally at most 50% by weight, preferably at most 30% by weight. The number average molecular weight of the polymer is preferably 10,000 to 1,000,000. If the molecular weight of the polymer is too low, the effect to inhibit the volume shrinkage becomes small. If the molecular weight is too high, the solubility of such a polymer in the monomer becomes low.

Methods for polymerizing the polymerizable monomer include heat polymerization and photopolymerization methods. In order to shorten operating time, the photopolymerization method is preferably adopted. When the thickness of the porous resin base is great, light is hard to be transmitted. In such a case, the heat polymerization method is preferably used.

In the case of the photopolymerization, a photopolymerization initiator is added to a polymerizable monomer or a polymerizable monomer solution. A proportion of the photopolymerization initiator added is generally 0.1 to 5% by weight based on the whole weight of the monomer. examples of the photopolymerization initiator include benzophenone and thioxanthone as those of a hydrogen abstraction type, and α-aminoalkylphenone, α-hydroxyalkyl-phenone and acylphosphine oxide as those of intramolecular cleavage.

In the case of heat polymerization, an azo compound such as azoisobutyronitrile or a peroxide such as dicumyl peroxide is added as a heat polymerization initiator to a polymerizable monomer or a polymerizable monomer solution. A proportion of the heat polymerization initiator added is generally 0.1 to 5% by weight based on the whole weight of the monomer.

Besides the polymerization initiator, additives such as a surfactant, an antioxidant, a photosensitizer, a lubricant and a parting agent may be added to the polymerizable monomer or polymerizable monomer solution as needed.

As a method for impregnating the porous structure of the porous resin base with the polymerizable monomer, may be used casting or dipping. After the impregnation, light irradiation or heating is conducted according to the kind of the polymerization initiator added to the polymerizable monomer to conduct polymerization, thereby forming a polymer.

3. Production Process of Perforated Porous Resin Base

In the present invention, a perforated porous resin base is produced a series of steps comprising the following Steps 1 to 4:

(1) Step 1 of impregnating the porous structure of a porous resin base with a liquid or solution;

(2) Step 2 of forming a solid substance from the liquid or solution impregnated;

(3) Step 3 of forming a plurality of perforations extending through from the first surface of the porous resin base having the solid substance within the porous structure to the second surface in the porous resin base; and (4) Step 4 of melting or dissolving the solid substance to remove it from the interior of the porous structure.

As described above, the process according to the present invention has a feature in that the porous structure of the porous resin base is impregnated with the liquid or solution, the solid substance is formed from the liquid or solution impregnated, and the perforations are then formed.

A machine-working method can be applied to the perforating. Since the solid substance is filled into the porous structure of the porous resin base, the perforating can be carried out in the same manner as in a nonporous resin base.

As the porous resin base, is generally used a porous resin sheet. As the porous resin sheet is preferred a porous fluorocarbon resin sheet, with an expanded PTFE being more preferred. The expanded PTFE sheet has, as a porous structure, a microstructure comprising fibrils and nodes connected to each other by the fibrils.

In Step 1, the liquid or solution is preferably impregnated into the porous structure of the porous resin base by casting or dipping. As the liquid used, is the above-described substance having a solidifying point or melting point within a range of from −150 to 150° C. As such a substance is preferred water, an alcohol, a hydrocarbon, a polymer or a mixture of two or more substances thereof. The substance having the solidifying point or melting point within the range of from −150 to 150° C. is preferably a paraffin having a melting point of at least 15° C.

In Step 1, the substance (water, alcohol, hydrocarbon or polymer) having the solidifying point or melting point within the range of from −150 to 150° C. is impregnated as a liquid of a temperature exceeding the solidifying point or melting point into the porous structure of the porous resin base. In Step 2, the substance is solidified at a temperature not higher than the solidifying point or melting point to form a solid substance.

In Step 3, perforations are formed in a state that the solid substance exists within the porous structure. In Step 4 after the perforating step, the substance is melted at a temperature exceeding the solidifying point or melting point to remove it. When the impregnating substance has a high melting point, a solvent is used to dissolve out it.

As the solution used in Step 1, may be used a solution of a soluble polymer or paraffin having a melting point of 15 to 30° C. When such a solution is used, the solution of the soluble polymer or paraffin is impregnated into the porous structure of the porous resin base in Step 1, the solvent is vaporized out in Step 2 to form a solid substance of the polymer or paraffin. In Step 3, perforations are formed in a state that the solid substance exists within the porous structure. In Step 4 after the perforating step, the solid substance is dissolved with a solvent to remove it.

In Step 1, a liquid or solution containing a compound capable of forming a solid substance by a chemical reaction may be used as the liquid or solution. The compound capable of forming a solid substance by a chemical reaction is preferably a polymerizable monomer undergoing a polymerization reaction by heat or light to form a polymer. As the liquid or solution containing the compound capable of forming a solid substance by a chemical reaction, may be used a polymerizable monomer solution also containing, in addition to a polymerizable monomer, a polymer obtained by the polymerization of the polymerizable monomer. As the polymerizable monomer, is preferred a monofunctional acrylate or methacrylate.

When the polymerizable monomer or the like is used, the liquid or solution containing the compound capable of forming a solid substance by a chemical reaction is impregnated into the porous structure of the porous resin base in Step 1, and the compound is subjected to the chemical reaction in Step 2 to form a solid substance. In Step 3, perforations are formed in a state that the solid substance exists within the porous structure. In Step 4 after the perforating step, the solid substance is dissolved with a solvent to remove it.

In the perforating Step 3, perforations are formed by means of, for example, i) a mechanically perforating method, ii) a method of etching by a light-abrasion method, or iii) a method of perforating by using an ultrasonic head equipped with at least one oscillator on the tip thereof and pressing the tip of the oscillator against the porous resin base to apply ultrasonic energy thereto.

The first surface and second surface of the porous resin base mean portions having a large surface area. For example, when the porous resin base is a sheet, the first surface or second surface means a surface (the so-called front or back surface of the sheet) of a wide flat portion, not a surface of a portion having a small thickness.

As the perforating method, is preferred the mechanically perforating method or the method (method of perforating by ultrasonically vibrating the tip of a tool) of perforating by using the ultrasonic head equipped with at least one oscillator on the tip thereof and pressing the tip of the oscillator against the porous resin base to apply ultrasonic energy thereto. As the mechanically perforating method (machine-working method), is preferred punching, blanking or drill. By ultrasonic vibration, a working speed is increased, and workability is improved.

A porous resin base rich in flexibility and elasticity, such as sponge, may be generally subjected to machine working with good precision at a temperature not higher than the first-order transition point of the resin or a temperature near to the first-order transition point like rubber materials. However, a porous resin material containing a great number of porous structures is difficult to retain its form at a temperature not higher than the first-order transition point thereof due to its friability in the vicinity of performed portions upon the machine working.

The present invention has a feature in that a state that the solid substance has been filled into the porous structure of the porous resin base is created, whereby mechanical perforating can be easily conducted. One of other excellent features of the present invention resides in that a substance having a solidifying point or melting point suited to the purpose of use is selected, whereby a working temperature can be selected irrespective of the first-order transition point of a resin forming the porous resin base. When a polymeric substance capable of being easily removed later on is filled into the porous structure of the porous resin base, the machine working can be easily conducted likewise.

When the porous resin base is a continuous sheet, for example, the impregnating step, the cooling step and the perforating step by the machine working are arranged in this order, and these steps are successively conducted, whereby the products can be continuously obtained. After the perforating step, the temperature is raised to a temperature higher than the solidifying point or melting point, whereby the solid substance can be removed as a liquid.

When the solution such as the polymer solution is used, it is only necessary to arrange a step of drying and removing the solvent in place of the cooling step. After the perforating step, a step of dissolving the solid substance with a solvent to remove it is arranged.

The perforated porous resin base obtained by the production process according to the present invention has perforations (through-holes) at a plurality of positions predetermined according to its use. The perforated porous resin base is free of deformation due to the perforating, collapse of the porous structure at peripheral portions of the perforations, including the inner wall surfaces thereof, and occurrence of burr, and the perforations have sharp edges.

Figure 2:
FIG. 2 is an enlarged microphotograph of a perforation formed by a process for perforating a porous resin base by means of a machine-working method.

FIG. 1 is a microphotograph of a perforated portion in an expanded PTFE sheet that was perforated in Example 1 of the present invention, and it can be seen that the perforations having sharp edges are formed. On the other hand, FIG. 2 is a microphotograph of a perforated portion in an expanded PTFE sheet that was perforated in Comparative Example 3, in which occurrence of burr and partial collapse of the porous structure are observed.

Since the porous structure is also retained on the inner wall surfaces of the perforations in the perforated porous resin base obtained by the production process according to the present invention, it may be applied to a separation membrane. When a conductive metal is applied to the inner wall surfaces of the perforations, it can be utilized as a material for connection between circuits or an anisotropically conductive material. When the porous resin base is an expanded PTFE base having a microstructure comprising fibrils and nodes connected to each other by the fibrils, it is rich in flexibility and elasticity, low in dielectric constant and particularly excellent in electrically insulating property because the porous structure is retained. The expanded PTFE base is also very useful as a medical device because it is excellent in chemical stability.

4. Production Process (1) of Porous Resin Base with the Inner Wall Surfaces of Perforations Made Conductive A process according to the present invention for producing a porous resin base (for example, an anisotropically conductive sheet) with the inner wall surfaces of perforations selectively made conductive is a process for selectively making the inner wall surfaces of the perforations conductive by a series of steps comprising the following Steps I to VI:

(1) Step I of impregnating the porous structure of a porous resin base including both surfaces thereof with a soluble polymer or paraffin, or a compound capable of forming a solid substance by a chemical reaction;

(2) Step II of forming a solid substance from the soluble polymer or paraffin, or the compound capable of forming a solid substance by a chemical reaction, which has been impregnated, to form a composite sheet of a structure that both surfaces of the porous resin base have a layer of the solid substance, and the solid substance is impregnated into the porous structure;

(3) Step III of forming a plurality of perforations extending through from the first surface of the composite sheet to the second surface in the composite sheet;

(4) Step IV of applying a catalyst facilitating a reducing reaction of a metal ion to the surfaces of the composite sheet including the inner wall surfaces of the respective perforations;

(5) Step V of removing the solid substance from the composite sheet; and (6) Step VI of using the catalyst applied to and remaining on the inner wall surfaces of the respective perforations in the porous resin base to apply a conductive metal to the inner wall surfaces.

In Step I, the soluble polymer or paraffin, or the compound capable of forming a solid substance by a chemical reaction is impregnated into the porous structure of the electrically insulating porous resin base (ordinarily, porous resin sheet) including both surfaces thereof.

In Step II, the solid substance is formed from the soluble polymer or paraffin, or the compound capable of forming a solid substance by a chemical reaction, which has been impregnated, to form a composite sheet of the structure that both surfaces of the porous resin base have a layer of the solid substance, and the solid substance is impregnated into the porous structure.

Processes for forming the composite sheet include a process comprising impregnating the soluble polymer or paraffin by a method of casting a solution or melt of the soluble polymer or paraffin on both surfaces of the porous resin base or dipping the porous resin base in a solution or melt of the soluble polymer or paraffin in Step I, and forming a composite sheet of the structure that both surfaces of the porous resin base have a solid layer of the soluble polymer or paraffin, and the solid soluble polymer or paraffin is impregnated into the porous structure by a method of vaporizing out the solvent or lowering the temperature of the porous resin base to a temperature not higher than the solidifying point or melting point of the soluble polymer or paraffin in Step II.

Other processes for forming the composite sheet include a process comprising impregnating the compound capable of forming a solid substance by a chemical reaction by a method of casting a liquid or solution containing such a compound on both surfaces of the porous resin base or dipping the porous resin base in a liquid or solution containing the compound in Step I, and forming a composite sheet of the structure that both surfaces of the porous resin base have a layer of the solid substance, and the solid substance is impregnated into the porous structure by a method of forming the solid substance by the chemical reaction in Step II.

In the case of the latter process, is preferably adopted a process comprising, in Step I, impregnating a polymerizable monomer undergoing a polymerization reaction by heat or light to form a polymer by a method of casting a liquid or solution containing the polymerizable monomer on both surfaces of the porous resin base or dipping the porous resin base in a liquid or solution containing the polymerizable monomer, and in Step II, forming a composite sheet of the structure that both surfaces of the porous resin base have a solid polymer layer, and a solid polymer is impregnated into the porous structure by a method of polymerizing the polymerizable monomer by heat or light to form the solid polymer.

When casting is conducted on the both surfaces of the porous synthetic resin sheet with a solution of the soluble resin or paraffin, or such a solution is impregnated into voids in the porous structure, for example, a ketone such as acetone or methyl ethyl ketone; an ester such as ethyl acetate or butyl acetate; a halogenated hydrocarbon such as dichloroethane or dichloromethane; an aromatic hydrocarbon such as xylene or toluene; a polar organic solvent such as tetrahydrofuran, chloroform, diacetone alcohol or dimethylformamide; or the like may be used as a solvent.

The solvent may be suitably selected according to the kinds of the soluble polymer, paraffin and porous resin base. For example, when an expanded PTFE sheet is used as the porous resin base, and polymethyl methacrylate (PMMA) is used as the soluble polymer, a polar solvent that can dissolve PMMA and is easy to penetrate into the porous structure of the expanded PTFE sheet, such as acetone or tetrahydrofuran, is preferably used as the solvent.

When the melting point of the soluble polymer is low, and so it can be melted by heating to a temperature of, preferably, 100° C. or lower, the melt thereof may be used to conduct casting and impregnation. When the paraffin also has not so high melting point, and the melting point is preferably 100° C. or lower, a melt obtained by heating it to a temperature not lower than the melting point can be used to conduct casting and impregnation.

When as a production process of the composite sheet, for example, an expanded PTFE sheet is used as the porous synthetic resin sheet, and PMMA is used as the masking material to impregnate it up to the interior of the porous structure, it is preferable to use a solution with PMMA dissolved at a concentration of about 10 to 30% by weight in a polar solvent that can dissolve PMMA and is easy to penetrate into the porous structure of the expanded PTFE sheet, such as acetone or tetrahydrofuran. It is only necessary to slowly dip the expanded PTFE sheet in this solution so as not leave air within the porous structure to impregnate it. According to the dipping method, the interior of the porous structure of the porous resin base can be filled with the soluble polymer, and at the same time the surface portion thereof can also be covered with the soluble polymer. This soluble polymer layer fulfills a function as a mask layer. Even when the high-melting paraffin is used, both surfaces of the porous resin base can be covered with the paraffin likewise to form mask layers.

When the expanded PTFE sheet is used as the porous resin base, PMMA is used as the masking material, and PMMA films are formed as mask layers on both surfaces of the expanded PTFE sheet, it is preferable to adopt a process comprising casting a solution with PMMA dissolved at a concentration of about 10 to 40% by weight in acetone, tetrahydrofuran or the like in the same manner as described above on both surfaces of the expanded PTFE sheet. In this case, it is preferable to conduct the casting while heating the expanded PTFE sheet to a temperature of about 30 to 60° C. to facilitate the vaporization of the solvent. According to the casting method, the soluble polymer is penetrated into not only the surface portion of the porous resin base, but also the interior of the porous structure under the surface portion.

When the paraffin is used, it is preferable to adopt a process comprising heating and melting the paraffin in a solid state at ordinary temperature and dipping the expanded PTFE sheet in the melt thus obtained to fill the interior of the porous structure with the paraffin.

When the interior of the porous structure of the porous resin base is filled with the soluble polymer or paraffin, collapse of the porous structure in the vicinity of worked portions, i.e., perforated portions can be prevented even when perforations are formed by a machine-working method. When the interior of the porous structure of the porous resin base is filled with the soluble polymer or paraffin, the porous structure can be sufficiently retained upon the formation of the perforations. However, the application of the catalyst is limited to the surface portions of the inner wall surfaces of the perforations.

On the other hand, when the mask layer is formed only in the vicinity of the surface of the porous resin base, the performance of retaining the porous structure in the vicinity of the perforations is lowered when the perforations are formed by a machine-working method. However, the catalyst can be applied up to a depth of about several microns from the surface of the inner wall surface in the step of applying the catalyst to the inner wall surfaces of the perforations though it varies according to the porosity of the porous resin base. When the soluble polymer or paraffin is impregnated into the porous structure of the porous resin base by the casting or dipping method, thus the degree of impregnation is controlled to form mask layers on both surfaces and to reduce the amount impregnated into the porous structure, whereby the catalyst can be sufficiently applied to the resin portion of the inner wall surfaces of the perforations after the perforating step.

In the present invention, a plurality of perforations (through-holes) extending through from the first surface of the composite sheet to the second surface are formed. Examples of methods for forming the perforations include i)

a mechanically perforating method, ii) a method of etching by a light-abrasion method, and iii) a method of perforating by using an ultrasonic head equipped with at least one oscillator on the tip thereof and pressing the tip of the oscillator against the composite sheet to apply ultrasonic energy thereto.

In order to mechanically perforate, there may be adopted a machine-working method, for example, pressing, punching or drilling method. According to the machine-working method, through-holes having a relatively large hole diameter of generally at least 100 μm, often at least 300 μm can be formed cheaply.

In order to form the through-holes by irradiation of laser beams, it is preferable to adopt a method comprising irradiate the surface of the composite sheet with laser beams through a light-screening sheet having a plurality of light-transmitting portions (openings) independent of one another in accordance with a predetermined pattern, thereby forming patterned through-holes. The portions irradiated with the beams transmitted through the plurality of the openings in the light-screening sheet are etched to form the through-holes. According to this method, through-holes having a small hole diameter can be formed.

In the ultrasonic method, the ultrasonic head equipped with at least one oscillator on the tip thereof is used to apply ultrasonic energy to the composite sheet, thereby forming patterned perforations in the composite sheet. The ultrasonic energy is applied only in the vicinity of the portions of the composite sheet, with which the tip of the oscillator comes into contact, to locally raise the temperature of the sheet by vibratory energy owing to ultrasonic waves, thereby easily cutting and removing the resin to form the perforations.

The form of the perforations (through-holes) may be any of circular, elliptical, star, octagonal, hexagonal, rectangular and triangular forms. The hole diameter of the perforations can be controlled to generally about 5 to 100 μm, preferably about 5 to 30 μm in application fields that a small hole diameter suits, while it can be controlled to generally about 100 to 3,000 μm, preferably about 150 to 2,000 μm, more preferably 200 to 1,500 μm in application fields that a relatively large hole diameter suits. The plurality of the perforations is preferably formed in a predetermined pattern corresponding to the distribution of electrodes of a circuit devices or the like.

When the perforations are formed in the composite sheet, the resin portion of the porous structure is exposed to the inner wall surfaces of the perforations. In the case of the expanded PTFE sheet, the resin portion of the porous structure is composed of fibrils and nodes formed from PTFE.

In the present invention, a catalyst facilitating a reducing reaction of a metal ion is applied to the surfaces of the composite sheet including the inner wall surfaces of the respective perforations. As a method for applying a conductive metal to the inner wall surfaces of the perforations in the porous resin base, is preferred an electroless plating method. In the electroless plating method, a catalyst facilitating a chemically reducing reaction is generally applied to portions to deposit a plated metal in advance. In order to conduct electroless plating only on the inner wall surfaces of the perforations in the porous resin base, it is necessary to apply the catalyst only to such portions. When a plated metal is applied to other portions than the inner wall surfaces of the perforations, there is a possibility that respective conductive portions formed by a conducted metal applied to the inner wall surfaces of the respective perforations may short-circuit.

When the plurality of the perforations are formed in the composite sheet, and the catalyst is applied to the surfaces of the composite sheet including the inner wall surfaces of the respective perforations, the catalyst is also applied to the resin portion of the porous structure exposed to the inner wall surfaces of the perforations in the porous resin base.

In order to apply the catalyst facilitating the chemically reducing reaction of a metal ion, it is only necessary to dip the composite sheet, in which the perforations have been formed, in, for example, a palladium-tin colloid catalyst-applying liquid while sufficiently stirring the liquid.

In the present invention, the soluble polymer or paraffin is removed from the composite sheet after the above-described step. The soluble polymer layers or paraffin layers remaining on both surfaces of the porous resin base may be released to remove them. However, it is preferable to adopt a method of dissolving them together with the soluble polymer or paraffin impregnated into the porous structure using a solvent.

No particular limitation is imposed on the solvent used in the dissolution and removal of the soluble polymer or paraffin so far as it can dissolve the soluble polymer or paraffin. However, it is preferably a solvent that does not dissolve or hardly dissolves the porous resin base. When the expanded PTFE sheet is used as the porous resin base, and PMMA is used as the masking material, it is preferable to use, as the solvent, a polar solvent such as acetone or tetrahydrofuran. In the case of the paraffin, it can be dissolved and removed with acetone or the like. The dissolution and removal of the soluble polymer or paraffin is conducted by a method of dipping the composite sheet in the solvent.

When the soluble polymer or paraffin is removed from the composite sheet, the catalyst applied to the inner wall surfaces of the perforations in the porous resin base remains.

In the present invention, the catalyst applied to remaining on the inner wall surfaces of the perforations (through-holes) in the porous resin base is utilized to apply the conductive metal to the inner wall surfaces. As a method for applying the conductive metal, is suitably adopted an electroless plating method.

The catalyst (for example, palladium-tin) remaining on the inner wall surfaces of the perforations is activated prior to the electroless plating. More specifically, the porous resin base is dipped in an organic acid salt or the like, which is commercially available for activating plating catalysts, thereby dissolving tin to activate the catalyst.

The porous resin base, to the inner wall surfaces of the perforations in which the catalyst has been applied, is dipped in an electroless plating solution, whereby the conductive metal can be deposited only to the inner wall surfaces of the perforations, thereby forming cylindrical conductive portions (also referred to as conductive paths or electrodes). Examples of the conductive metal include copper, nickel, silver, gold and nickel alloys. When particularly high conductivity is required, copper is preferably used.

When the expanded PTFE sheet is used, plating particles (crystal grains) are first deposited so as to be entangled in fibrils exposed to the inner wall surfaces of the perforations in the porous PTFE sheet, so that the condition of the conductive metal applied can be controlled by controlling the time of the plating. If the time of the electroless plating is too short, it is difficult to achieve conductivity in the thickness-wise direction of the sheet. If the time of the electroless plating is too long, the conductive metal becomes a metal mass, so that it is difficult to elastically recover the sheet under a compressive load ordinarily used. The plating is conducted in a moderate amount, whereby the conductive metal layers can be formed in the state that the porous structure has been retained, so that it is possible to impart the conductivity in the thickness-wise direction together with the elasticity.

The thickness (for example, the thickness of fibrils of the expanded PTFE sheet) of the resin portion of the porous structure is preferably at most 50 µm. The particle diameter of the conductive metal is preferably about 0.001 to 5 µm. The amount of the conductive metal applied is preferably controlled to about 0.01 to 4.0 g/ml for the purpose of retaining the porous structure and elasticity.

In order to improve the prevention of oxidation and electrical contact property, the cylindrical conductive portions formed in the above-described process preferably makes use of an antioxidant or is coated with a noble metal or noble metal alloy. As the noble metal, palladium, rhodium or gold is preferred in that it has a low electric resistance. The thickness of the coating layer formed of the noble metal or the like is preferably 0.005 to 0.5 µm, more preferably 0.01 to 0.1 µm. If the thickness of this coating layer is too small, the effect to improve the electrical contact property becomes small. If the thickness is too great, the coating layer becomes liable to be separated. It is hence not preferable to coat the conductive portions in such a too small or too great thickness. When the conductive portions are coated with, for example, gold, a method of coating the conductive metal layers with nickel of about 8 nm and then conducting displacement plating with gold is effective.

According to the production process of the present invention, the perforations extending through from the first surface to the second surface can be formed at a plurality of positions of the porous resin base. In addition, an anisotropically conductive sheet that has conductive portions formed by the conductive metal applied to the resin portion of the porous structure in the inner wall surfaces of the perforations and permits imparting conductivity only to the thickness-wise direction of the sheet by the conductive portions can be produced.

Figure 3:
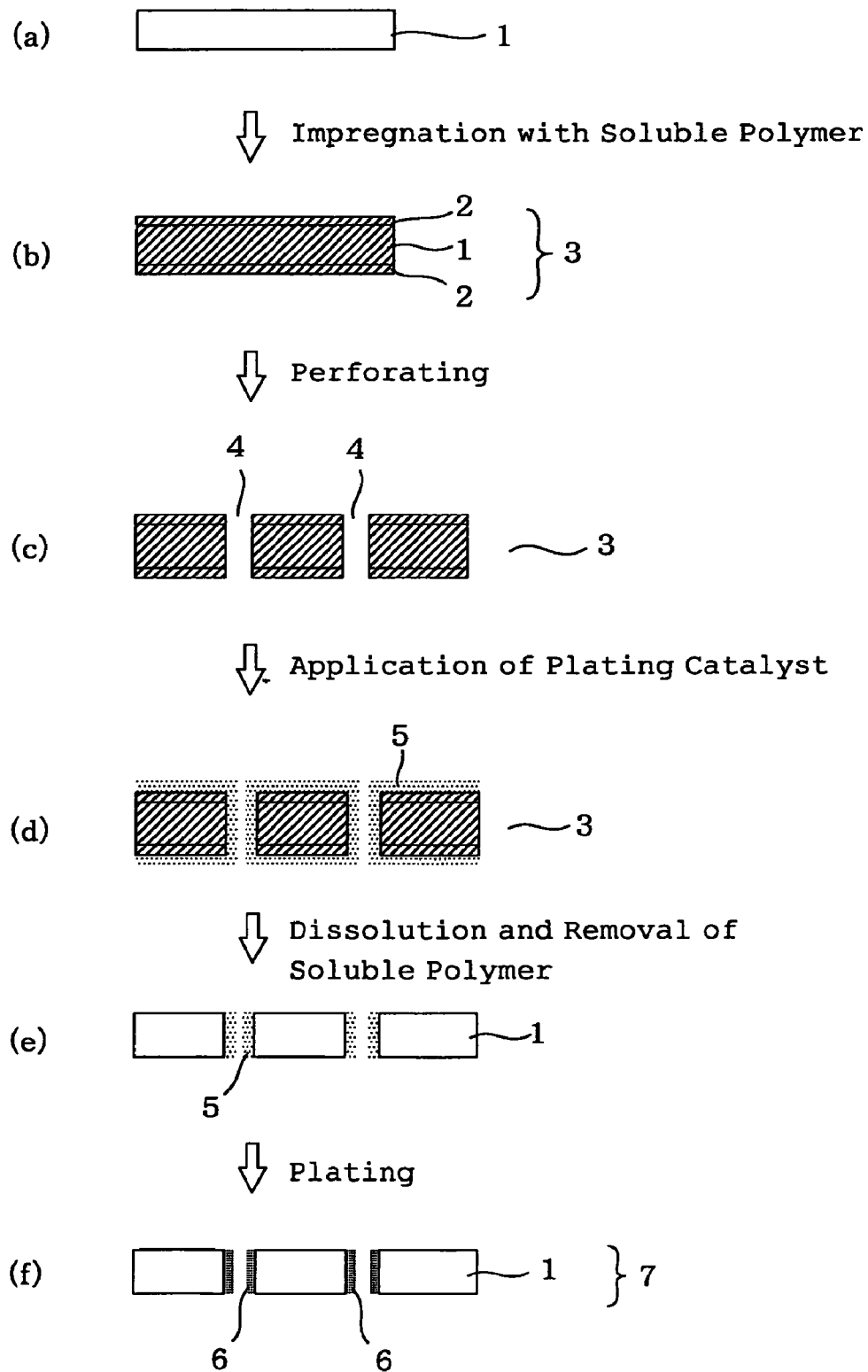
FIG. 3 is a flow diagram illustrating the steps of a process according to the present invention for producing a porous resin base with the inner wall surfaces of perforations made conductive.

While referring to the drawing, the above-described production process is described taking the case of using the soluble polymer or paraffin as an example. FIG. 3 is a flow diagram illustrating an exemplary production process according to the present invention. As illustrated in FIG. 3(a), a porous resin base (for example, expanded PTFE sheet) 1 is provided. As illustrated in FIG. 3(b), the interior of the porous structure, including both surfaces thereof, is impregnated with a soluble polymer 2 to prepare a composite sheet 3, which has soluble polymer layers (coating layers) on both surfaces and in which the soluble polymer has been impregnated into the porous structure. As illustrated in FIG. 3(c), the composite sheet is then perforated to produce a composite sheet, in which a plurality of perforations 4, 4 have been formed.

As illustrated in FIG. 3(d), a plating catalyst 5 is applied to the surfaces of the composite sheet including the inner wall surfaces of the perforations. As illustrated in FIG. 3(e), the soluble polymer is then dissolved and removed, whereby the plating catalyst applied to the surfaces of the soluble polymer layers (mask layers) on both surfaces of the porous resin base is removed together with the soluble polymer, and only the catalyst applied to the inner wall surfaces of the perforations in the porous resin base remains. FIG. 3(f) illustrates an electroless plating step. When the electroless plating is conducted, plating particles (conductive metal particles) are deposited only on the inner wall surfaces of the perforations, to which the catalyst has been applied, to form conductive metal layers 6. A porous resin base 7 with only the inner wall surfaces of the perforations selectively made conducted can be obtained in such a manner.

In the above-described production process, a porous resin sheet is preferably used as the porous resin base. As the porous resin sheet, is preferred a porous fluorocarbon resin sheet, with an expanded PTFE sheet having, as a porous structure, a microstructure comprising fibrils and nodes connected to each other by the fibrils being more preferred. The soluble polymer or paraffin is preferably in a solid state at a temperature within a range of 15 to 30° C.

In Step I, a solution or melt of the soluble polymer or paraffin is cast on both surfaces of the porous resin base, or the porous resin base is dipped in the solution or melt of the soluble polymer or paraffin. In Step II, the composite sheet of the structure that both surfaces of the porous resin base have a solid layer of the soluble polymer or paraffin, and the solid soluble polymer or paraffin is impregnated into the porous structure is preferably formed by a method of vaporizing out the solvent or lowering the temperature of the porous resin base to a temperature not higher than the solidifying point or melting point of the soluble polymer or paraffin.

In Step III, a plurality of the perforations are preferably formed in the composite sheet by i) a mechanically perforating method, ii) a method of etching by a light-abrasion method, or iii) a method of perforating by using an ultrasonic head equipped with at least one oscillator on the tip thereof and pressing the tip of the oscillator against the composite sheet to apply ultrasonic energy thereto.

In Step V, the soluble polymer or paraffin is preferably dissolved and removed by using a solvent that does not dissolve or hardly dissolves the porous resin base, but exhibits good solubility for the soluble polymer or paraffin. In Step V, the soluble polymer or paraffin may also be melted and removed.

In Step VI, the conductive metal is preferably applied to the inner wall surfaces of the respective perforations by electroless plating. According to the production process of the present invention, there can be produced an anisotropically conductive sheet, in which the porous resin base with the inner wall surfaces of the perforations made conductive has conductive portions formed by the conductive metal applied to the resin portion of the porous structure in the inner wall surfaces of the plurality of the perforations extending through from the first surface to the second surface, and which permits imparting conductivity only to the thickness-wise direction of the sheet by the conductive portions.

With respect to the above-described production process, the case where the soluble polymer or paraffin is used has been mainly described. However, a compound capable of forming a solid substance by a chemical reaction, such as a polymerizable monomer, may also be used in place of such a substance to form mask layers by the solid substance likewise, thereby producing a porous resin base (anisotropically conductive sheet) with only the inner wall surfaces of perforations made conductive.

5. Production Process (2) of Porous Resin Base with the Inner Wall Surfaces of Perforations Made Conductive Another process according to the present invention for producing a porous resin base (for example, an anisotropically conductive sheet) with the inner wall surfaces of perforations selectively made conductive is a process for selectively making the inner wall surfaces of the perforations conductive by a series of steps comprising the following Steps i to viii:

(1) Step i of laminating, as mask layers, porous resin layers (B) and (C) on both surfaces of a porous resin base (A) to form a laminate of a 3-layer structure;

(2) Step ii of impregnating the respective porous structures of the laminate with a soluble polymer or paraffin, or a compound capable of forming a solid substance by a chemical reaction;

(3) Step iii of forming a solid substance from the soluble polymer or paraffin, or the compound capable of forming a solid substance by a chemical reaction, which has been impregnated;

(4) Step iv of forming a plurality of perforations extending through from the first surface of the laminate having the solid substance within the respective porous structures to the second surface in the laminate;

(5) Step v of dissolving the solid substance to remove it from the interiors of the respective porous structures;

(6) Step vi of applying a catalyst facilitating a reducing reaction of a metal ion to the surfaces of the laminate including the inner wall surfaces of the respective perforations;

(7) Step vii of removing the mask layers from both surfaces of the porous resin base (A); and (8) Step viii of using the catalyst applied to and remaining on the inner wall surfaces of the respective perforations in the porous resin base (A) to apply a conductive metal to the inner wall surfaces.

In the above-described process, the solid polymer or paraffin is preferably formed by a process comprising impregnating the soluble polymer or paraffin by casting a solution or melt of the soluble polymer or paraffin on both surfaces of the laminate or dipping the laminate in a solution or melt of the soluble polymer or paraffin in Step ii, and vaporizing out the solvent or lowering the temperature of the laminate to a temperature not higher than the solidifying point or melting point of the soluble polymer or paraffin in Step iii.

In the above process, the solid polymer or paraffin is also preferably formed by impregnating a liquid or solution containing, as the compound capable of forming a solid substance by a chemical reaction, a polymerizable monomer undergoing a polymerization reaction by heat or light to form a polymer into the respective porous structures of the laminate in Step ii, and polymerizing the polymerizable monomer by heat or light in Step iii.

Figure 4:
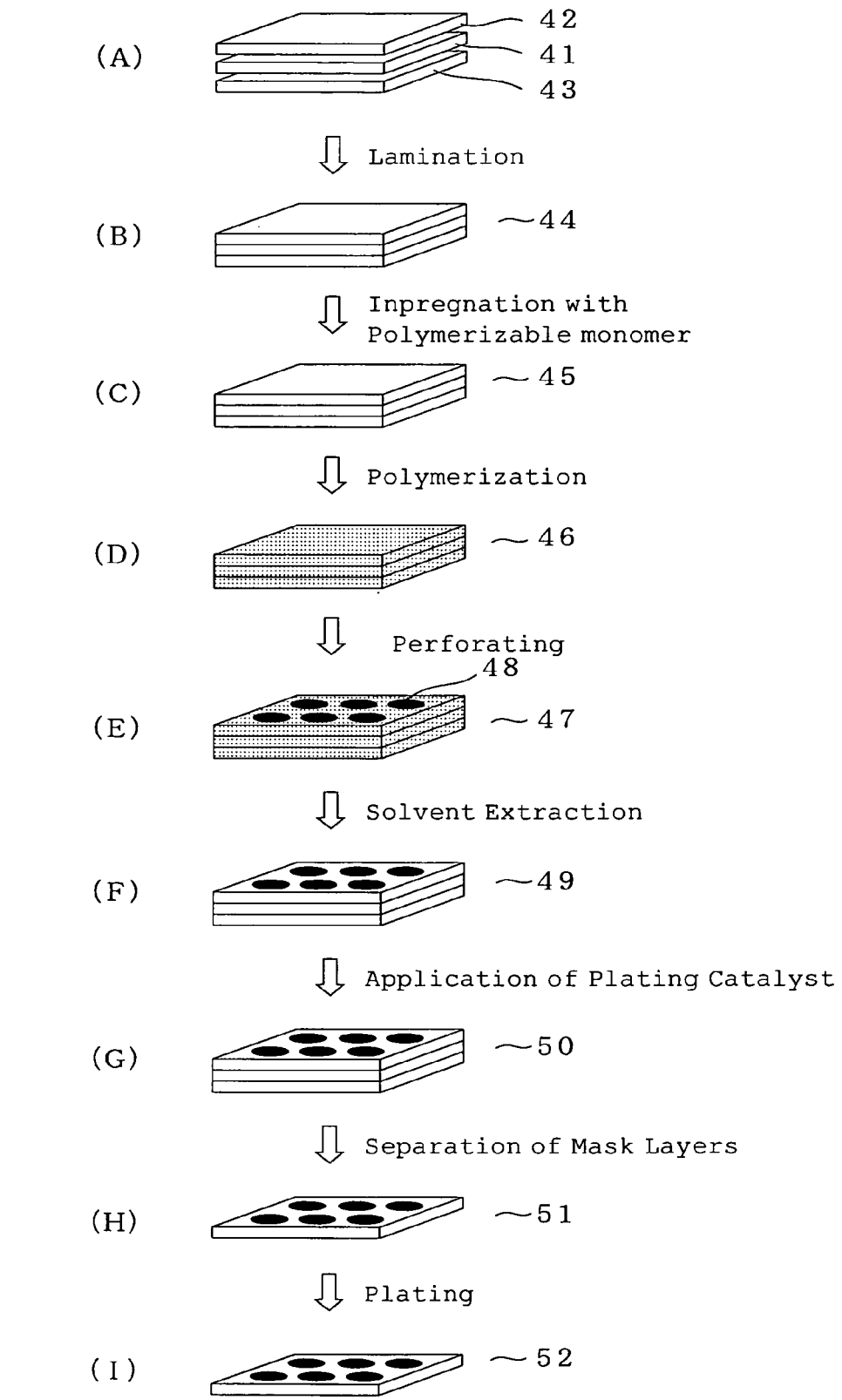
FIG. 4 is a flow diagram illustrating the steps of another process according to the present invention for producing a porous resin base with the inner wall surfaces of perforations made conductive.

While referring to the drawing, the above-described production process is described taking the case of using the soluble polymer as an example. FIG. 4 is a flow diagram illustrating the respective steps adopted in the production process of the present invention. As illustrated in FIGS. 4(A) and 4(B), porous resin layers 42 and 43 are laminated as mask layers on both surfaces of a porous resin base 41 to form a laminate 44 of a 3-layer structure. The porous resin layers, which will become mask layers, may be the same or different from the porous resin base. The same 3 porous resin bases are generally used to form the laminate.

In order to effectively mask both surfaces of the porous resin base 41, it is preferable to fusion bond the respective layers to each other to integrate them. When expanded PTFE sheets are used as the porous resin base and mask layers, the respective layers are easily fusion bonded to each other and integrated by heating and pressure welding them, and the mask layers can be easily separated if necessary.

As illustrated in FIG. 4(C), a liquid or solution containing the compound capable of forming a solid substance by a chemical reaction into the respective porous structures of the laminate 44. As the compound capable of forming a solid substance by a chemical reaction, is preferred a polymerizable monomer undergoing a polymerization reaction by heat or light to form a polymer. The liquid or solution containing the compound capable of forming a solid substance by a chemical reaction may be a solution also containing, in addition to a polymerizable monomer, a polymer obtained by the polymerization of the polymerizable monomer.

As the polymerizable monomer, is preferred the above-described monofunctional acrylate or methacrylate such as methyl methacrylate. A photopolymerization initiator or heat polymerization initiator is added to the polymerizable monomer.

As illustrated in FIG. 4(D), the compound in the liquid or solution impregnated is subjected to a chemical reaction to form a solid substance. In this step, the polymerizable monomer is subjected to photopolymerization or heat polymerization to form a polymer (for example, PMMA) in a solid state at ordinary temperature. In such a manner, a laminate 46 in which all the 3 layers have been filled with the polymer is obtained.

As illustrated in FIG. 4(E), a plurality of perforations 48 extending through from the first surface of the laminate having the solid substance within the respective porous structures to the second surface are then formed in the laminate. As illustrated in FIG. 4(F), the solid substance (polymer) is dissolved with a solvent to remove it from the interiors of the respective porous structures in the laminate 47 in which the perforation have been formed.

As illustrated in FIG. 4(G), a catalyst (plating catalyst) facilitating a reducing reaction of a metal ion is applied to the surfaces of the laminate 49 subjected to the solvent extraction, including the inner wall surfaces of the respective perforations. At this time, the porous resin layers 42 and 43 arranged on both surfaces function as respective mask layers to prevent the catalyst from being applied to both surfaces of the porous resin base 41.

As illustrated in FIG. 4(H), the mask layers 42 and 43 are then removed from the laminate 50, to which the plating catalyst has been applied, to obtain a porous resin base 51 with the plating catalyst applied only to the inner wall surfaces of the perforations. As illustrated in FIG. 4(I), the catalyst applied to and remaining on the inner wall surfaces of the respective perforations in the porous resin base 51 is used to apply a conductive metal to the inner wall surfaces. The application of the conductive metal is generally conducted by an electroless plating method. In such a manner, a porous resin base 52 with only the inner wall surfaces of the perforations made conductive can be obtained.

As the porous resin base, is preferred a porous resin sheet. As the porous resin sheet, is preferred a porous fluorocarbon resin sheet, with an expanded PTFE sheet, with an expanded PTFE sheet having, as a porous structure, a microstructure comprising fibrils and nodes connected to each other by the fibrils being more preferred.

In Step iv, a plurality of the perforations are preferably formed in the laminate by i) a mechanically perforating method, ii) a method of etching by a light-abrasion method, or iii) a method of perforating by using an ultrasonic head equipped with at least one oscillator on the tip thereof and pressing the tip of the oscillator against the laminate to apply ultrasonic energy thereto.

In Step v, the solid substance is preferably dissolved and removed by using a solvent that does not dissolve or hardly dissolves the porous resin base, but exhibits good solubility for the solid substance.

In Step vi, the catalyst (plating catalyst) facilitating the reducing reaction of the metal ion is applied to the surfaces of the laminate including the inner wall surfaces of the respective perforations. In this production process, the solid substance has been dissolved and removed from the interior of the porous structure in Step v prior to the application of the plating catalyst, so that the resin portion (for example, fibrils of PTFE) of the inner wall surfaces of the perforations is sufficiently exposed. Therefore, the plating catalyst can be firmly applied up to the resin portion (resin portion located at a depth of about several microns from the surface of the inner wall surface) located at a somewhat interior position of the porous structure of the inner wall surfaces of the perforations. In Step viii, the conductive metal is preferably applied to the inner wall surfaces of the respective perforations by electroless plating.

According to the production process of the present invention, there can be produced an anisotropically conductive sheet, in which the porous resin base with the inner wall surfaces of the perforations made conductive has conductive portions formed by the conductive metal applied to the resin portion of the porous structure in the inner wall surfaces of the plurality of the perforations extending through from the first surface to the second surface, and which permits imparting conductivity only to the thickness-wise direction of the sheet by the conductive portions.

EXAMPLES

The present invention will hereinafter be described more specifically by the following Examples and Comparative Examples. However, the present invention is not limited to these examples only. Physical properties were measured in accordance with the following respective methods.

(1) Bubble Point (BP):

A bubble point of a porous PTFE film by an expanding process was measured in accordance with ASTM-F-316-76 using isopropyl alcohol.

(2) Porosity:

A porosity of a porous PTFE film by an expanding process was measured in accordance with ASTM D-792.

Figure 5:
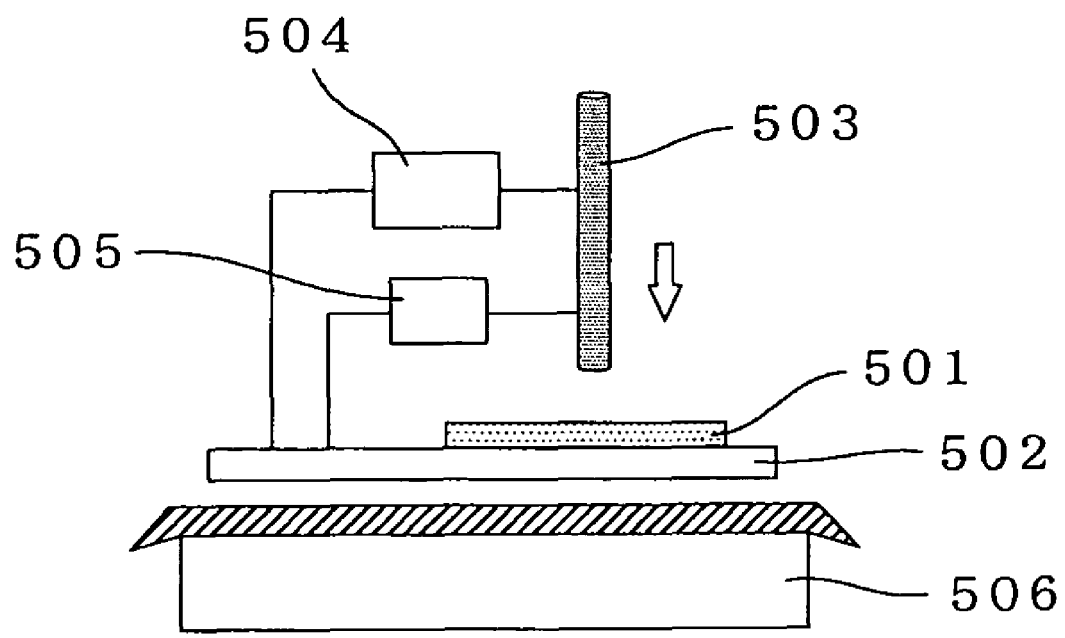
FIG. 5 is a schematic cross-sectional view of a testing equipment for anisotropically conductive sheets.

(3) Conduction-Starting Load:

A conduction-starting load of an anisotropically conductive film was measured by means of a testing equipment illustrated in FIG. 5. In the testing equipment illustrated in FIG. 5, an anisotropically conductive sheet 501 is placed on a copper plate (referred to as "Au plate") 502 plated with gold. The whole thereof is placed on a weigher 506. A copper rod 503 having an outer diameter of 2 mm is used as a probe to apply a load. A resistance value of the anisotropically conductive sheet was measured by a four probe method. Reference numeral 504 indicates a constant-current power source, and reference numeral 505 denotes a voltmeter.

Example 1

A porous PTFE base having an area of 10 cm$^2$, a porosity of 60%, an average pore diameter of 0.1 μm and a thickness of 0.5 mm was provided. This porous PTFE base is an expanded PTFE sheet produced by an expanding process and having a microstructure comprising fibrils and nodes connected to each other by the fibrils.

After the expanded PTFE sheet was dipped in ethanol to subject it to a hydrophilization treatment, the thus-treated sheet was impregnated with water and cooled to 0° C. or lower to solidify water. The expanded PTFE sheet with the solidified water filled into the porous structure thereof was perforated by means of a combination of a punch and a die, which forms through-holes having a diameter of 250 μm. A perforating rate was 100 holes/min. After the perforating, the temperature of the sheet was returned to ordinary temperature, and water was removed by drying.

A perforated portion of the perforated sheet was observed through a microscope. As a result, it was found that peripheries of the perforations were not collapsed as illustrated in FIG. 1, and the inner wall surfaces of the perforations also had almost a surface cut along the punching surface. The peripheries of the perforations were the same porous as in other portions than the perforated portions, and no change in the microstructure was observed.

Example 2

After the same expanded PTFE sheet as that used in Example 1 was provided, impregnated with water and cooled to a temperature not higher than the solidifying point of water, the sheet was perforated by means of a blanking blade produced in such a manner that the diameter of through-holes formed is 1 mm. A perforating rate was 100 through-holes/4 minutes. After the perforating, the temperature of the sheet was returned to ordinary temperature, and water was removed by drying. A perforated portion of the perforated sheet was then observed. As a result, neither deformation nor burr was observed at peripheries of the perforations like Example 1, and the microstructure of the peripheries of the perforations also retained the same form as other portions than the perforated portions.

Example 3

After the same expanded PTFE sheet as that used in Example 1 was provided, impregnated with water and cooled to a temperature not higher than the solidifying point of water, the sheet was perforated by means of a drill controlled in such a manner that the diameter of through-holes formed is 250 μm. At this time, the number of revolutions of the drill was 100,000 rpm. A perforating rate was 100 through-holes/2 minutes. After the perforating, the temperature of the sheet was returned to ordinary temperature, and water was removed by drying. A perforated portion of the perforated sheet was then observed. As a result, no burr was observed at peripheries of the perforations like Example 1, and no collapse of the periphery of the perforated portion was also observed.

Example 4

After the same expanded PTFE sheet as that used in Example 1 was provided, impregnated with water and cooled to a temperature not higher than the solidifying point of water, the sheet was perforated by means of a blanking blade produced in such a manner that the diameter of through-holes formed is 1 mm. Upon the perforating, ultrasonic vibration of 40 kHz and 25 W was applied to the tip of the blade.

A perforating rate was 100 through-holes/2 minutes. It took only a half compared with Example 2 to operate the sheet. After the perforating, the temperature of the sheet was returned to ordinary temperature, and water was removed by drying. The perforations were then observed. As a result, neither collapse nor burr was observed at peripheries of the perforations, and the edges of the perforations were finished smoothly and sharply.

Example 5

The same expanded PTFE sheet as that used in Example 1 was provided, and an acetone solution of polymethyl methacrylate (PMMA) was separately provided. The acetone solution was placed in a container having a size that the PTFE sheet can be horizontally dipped, and impregnated into the expanded PTFE sheet by a dipping method. Acetone was removed by drying to form a composite sheet of PTFE-PMMA. This composite sheet was perforated at 100,000 rpm by means of a drill that the diameter of through-holes formed is 250 μm. It took 4 minutes to form 100 perforations. After completion of the perforating, the expanded PTFE sheet was dipped in acetone to dissolve out PMMA, thereby obtaining a perforated expanded PTFE sheet. The perforations were observed through a microscope. As a result, there was no change in the microstructure at peripheries of the perforations, and neither collapse nor burr was observed at the edges of the perforations.

Comparative Example 1

The same expanded PTFE sheet as that used in Example 1 was provided, and the sheet was perforated in an intact state by means of a punch and a die, which form through-holes having a diameter of 500 μm. The perforating time was such that 100 perforations were formed in a minute like Example 1. After the operation, the perforations were observed. As a result, burr occurred, and the hole diameter of 500 μm was not retained. In addition, the microstructure of peripheries of the perforations was partially in a twitched state, and so the porous structure was not retained.

Comparative Example 2

The same expanded PTFE sheet as that used in Example 1 was provided, and the sheet was perforated in an intact state by means of the same blanking blade as that used in Example 2. The perforating time was such that 100 perforations were formed in 4 minutes like Example 2. After the operation, the perforations were observed. As a result, burr occurred. In addition, the peripheries of the perforations were in a collapsed state, and it was observed that the microstructure of that portion was clearly different from other portions.

Comparative Example 3

The same expanded PTFE sheet as that used in Example 1 was provided, and the sheet was perforated in an intact state by means of a drill. The drill used was the same as that used in Example 3. The number of revolutions was also 100,000 rpm likewise. The perforating time was such that 100 perforations were formed in 2 minutes like Example 3. After the perforating, the perforations were observed. As a result, it was observed that burr occurred, and moreover the resin was twitched due to the revolution, and the peripheries of the perforations were in a collapsed state.

Example 6

Twenty-five grams of a methacrylic resin (PMMA; product of Sumitomo Chemical Co., Ltd., trade name "LG6A") was dissolved in 75 g of acetone at room temperature to prepare a solution of the methacrylic resin. An expanded PTFE sheet (product of SUMITOMO ELECTRIC FINE POLYMER, INC., trade name "HP-010-30"; bubble point with isopropyl alcohol: 150 kPa; porosity: 60%) cut out into a 2 cm square was slowly dipped in the methacrylic resin solution while taking care that air is not left within the porous structure thereof. After it was confirmed that the expanded PTFE sheet became translucent, and the methacrylic resin-solution was completely impregnated into the porous structure thereof, it was taken out and air-dried for about 18 hours at room temperature. Through-holes (perforations) were formed at a plurality of positions in the composite sheet thus obtained at 100,000 rpm by means of a drill having a diameter of 250 μm.

After the composite sheet, in which the through-holes had been formed, was then dipped for 1 minute in ethanol to hydrophilize it, the sheet was dipped for 4 minutes at a temperature of 60° C. in Melplate PC-321 produced by Meltex Inc., which was diluted to 100 ml/L, to conduct conditioning. After the composite sheet was further dipped for 1 minute in 10% sulfuric acid, it was dipped for 2 minutes in a solution with Enplate PC-236 produced by Meltex Inc. dissolved in a proportion of 180 g/L in 0.8% hydrochloric acid as predipping.

The composite sheet was further dipped for 5 minutes in a solution with Enplate PC-236 produced by Meltex Inc. dissolved in a proportion of 150 g/L in an aqueous solution of 3% Enplate Activator 444 produced by Meltex Inc., 1% Enplate Activator Additive and 3% hydrochloric acid to apply tin-palladium colloid particles to the surfaces and wall surfaces of the through-holes of the composite sheet.

The composite sheet thus treated was then dipped in acetone to extract (dissolve and remove) the methacrylic resin impregnated into the expanded PTFE sheet, thereby obtaining an expanded PTFE sheet with palladium-tin particles applied only to the wall surfaces of the through-holes in the expanded PTFE sheet. The sheet thus obtained was further dipped in a liquid obtained by diluting PA-360 produced by Meltex Inc. in a proportion of 50 ml/L with purified water to dissolve tin, thereby activating the catalyst.

The thus-treated expanded PTFE sheet was immersed for 30 minutes in an electroless copper plating solution prepared with each 5% of Melplate Cu-3000A, Melplate Cu-3000B, Melplate Cu-3000C and Melplate Cu-3000D, and 1% of Melplate Cu-3000 Stabilizer, which were all products of Meltex Inc., while sufficiently conducting air stirring, thereby depositing copper particles only on the wall surfaces of the through-holes to make them conductive. The copper particles were then plated with gold for the purpose of improving rust prevention and contacting ability with devices. With respect to the gold plating, a gold displacement plating method from nickel was adopted in accordance with the following process.

After the expanded PTFE sheet with the copper particles applied to the wall surfaces of the perforations was dipped for 3 minutes in Activator Orotech SIT Additive (80 ml/L) produced by Atotech as predipping, the sheet was dipped for 1 minute in a solution prepared by Activator Orotech SIT Activator Concentrate (125 mg/L) produced by Atotech and Activator Orotech SIT Additive (80 ml/L) produced by Atotech for applying a catalyst, and further dipped for 1 minute in Orotech SIT Postdip (25 mg/L) produced by Atotech to apply a palladium catalyst to the copper particles.

The expanded PTFE sheet was then dipped for 5 minutes in an electroless nickel plating solution prepared by sodium hyposulfite (20 g/L), trisodium citrate (40 g/L), ammonium borate (13 g/L) and nickel sulfate (22 g/L) to coat the copper particles with nickel.

Thereafter, the expanded PTFE sheet was dipped for 5 minutes in a gold displacement plating solution [Melplate AU-6630A (200 ml/L), Melplate AU-6630B (100 ml/L), Melplate AU-6630C (20 g/L) and aqueous solution of sodium gold sulfite (10 g/L in terms of gold)] produced by Meltex Inc. to coat the copper particles with gold, thereby obtaining an anisotropically conductive sheet by an expanded PTFE sheet with only the wall surfaces of the through-holes of 1.00 mm made conductive.

The anisotropically conductive sheet comprising the expanded PTFE sheet obtained in the above-described manner as a base film was cut into 10 mm square, and a conduction-starting load of the cut sheet was measured by means of the testing equipment shown in FIG. 5. A copper rod having a diameter of 2 mm was used as a probe, and the probe was brought into contact with an electrode to measure a resistance value by the four probe method. As a result, the resistance value was 3.1Ω under a pressing load of 5.0 MPa.

Example 7

Paraffin (product of Wako Pure Chemical Industries, Ltd., melting point: 68-70° C.) was contained in a stainless steel container placed on a hot plate of 80° C. to melt it. An expanded PTFE sheet (product of SUMITOMO ELECTRIC FINE POLYMER, INC., trade name "HP-010-30"; bubble point with isopropyl alcohol: 150 kPa; porosity: 60%) cut out into a 2 cm square was slowly dipped in the molten paraffin while taking care that air is not left within the voids of the porous structure thereof. After it was confirmed that the expanded PTFE sheet became translucent, and the paraffin was completely impregnated into the porous structure thereof, it was taken out and air-cooled at room temperature to solidify the molten paraffin. Through-holes (perforations) were formed at a plurality of positions in the composite sheet thus obtained at 100,000 rpm by means of a drill having a diameter of 250 μm.

After the composite sheet, in which the through-holes had been formed, was then dipped for 1 minute in ethanol to hydrophilize it, the sheet was dipped for 4 minutes at a temperature of 60° C. in Melplate PC-321 produced by Meltex Inc., which was diluted to 100 ml/L, to conduct conditioning. After the composite sheet was further dipped for 1 minute in 10% sulfuric acid, it was dipped for 2 minutes in a solution with Enplate PC-236 produced by Meltex Inc. dissolved in a proportion of 180 g/L in 0.8% hydrochloric acid as predipping.

The composite sheet was further dipped for 5 minutes in a solution with Enplate PC-236 produced by Meltex Inc. dissolved in a proportion of 150 g/L in an aqueous solution of 3% Enplate Activator 444 produced by Meltex Inc., 1% Enplate Activator Additive and 3% hydrochloric acid to apply tin-palladium colloid particles to the surfaces and wall surfaces of the through-holes of the composite sheet. The sheet was further dipped in a liquid obtained by diluting PA-360 produced by Meltex Inc. in a proportion of 50 ml/L with purified water to dissolve tin, thereby activating the catalyst.

The composite sheet thus treated was then dipped in acetone to extract and remove the paraffin impregnated into the expanded PTFE sheet, thereby obtaining an expanded PTFE sheet with palladium-tin particles applied only to the wall surfaces of the through-holes.

The thus-obtained expanded PTFE sheet was immersed for 30 minutes in an electroless copper plating solution prepared with each 5% of Melplate Cu-3000A, Melplate Cu-3000B, Melplate Cu-3000C and Melplate Cu-3000D, and 1% of Melplate Cu-3000 Stabilizer, which were all products of Meltex Inc., while sufficiently conducting air stirring, thereby making only the wall surfaces of the through-holes conductive with copper particles.

The copper particles were then coated with gold for the purpose of improving rust prevention and contacting ability with devices. With respect to the coating by the gold plating, a gold displacement plating method from nickel was adopted in accordance with the following process.

After the expanded PTFE sheet with the copper particles applied to the wall surfaces of the perforations was dipped for 3 minutes in Activator Orotech SIT Additive (80 ml/L) produced by Atotech as predipping, the sheet was dipped for 1 minute in a solution prepared by Activator Orotech SIT Activator Concentrate (125 mg/L) produced by Atotech and Activator Orotech SIT Additive (80 ml/L) produced by Atotech for applying a catalyst, and further dipped for 1 minute in Orotech SIT Postdip (25 mg/L) produced by Atotech to apply a palladium catalyst to the copper particles.

The expanded PTFE sheet was then dipped for 5 minutes in an electroless nickel plating solution prepared by sodium hyposulfite (20 g/L), trisodium citrate (40 g/L), ammonium borate (13 g/L) and nickel sulfate (22 g/L) to coat the copper particles with nickel.

Thereafter, the expanded PTFE sheet was dipped for 5 minutes in a gold displacement plating solution [Melplate AU-6630A (200 ml/L), Melplate AU-6630B (100 ml/L), Melplate AU-6630C (20 g/L) and aqueous solution of sodium gold sulfite (10 g/L in terms of gold)] produced by Meltex Inc. to coat the copper particles with gold, thereby obtaining an anisotropically conductive sheet by an expanded PTFE sheet with only the wall surfaces of the through-holes of 1.00 mm made conductive.

The anisotropically conductive sheet comprising the expanded PTFE sheet obtained in the above-described manner as a base film was cut into 10 mm square, and a conduction-starting load of the cut sheet was measured by means of the apparatus shown in FIG. 5. A copper rod having a diameter of 2 mm was used as a probe, and the probe was brought into contact with an electrode to measure a resistance value by the four probe method. As a result, the resistance value was 3.9Ω under a pressing load of 5.0 MPa.

Comparative Example 4

Through-holes (perforations) were formed at a plurality of positions in an expanded PTFE sheet (HP-010-30, product of SUMITOMO ELECTRIC FINE POLYMER, INC.) at 100,000 rpm by means of a drill having a diameter of 250 μm. It was then attempted to make only the wall surfaces of the through-holes conductive in the same manner as in Example 1. However, the porous structure (microstructure) of the inner wall surfaces of the through-holes was collapsed, so that the copper particles could not be anchored thereto to deposit the copper particles.

Example 8

To 100 g of methyl methacrylate (LIGHT-ESTER M, product of KYOEISHA CHEMICAL Co., LTD.) was added 0.2 g of azobisisobutyronitrile (product of Wako Pure Chemical Industries, Ltd.) as a heat polymerization initiator, and the resultant mixture was stirred. The same expanded PTFE sheet as that used in Example 1 was provided and impregnated with the methyl methacrylate solution. The expanded PTFE sheet impregnated with the methyl methacrylate solution was heated at 80° C. for 4 hours on a hot plate to heat-polymerize methyl methacrylate.

After the polymerization, the expanded PTFE sheet was perforated by means of a combination of a punch and a die, which forms through-holes having a diameter of 250 μm. A perforating rate was 100 holes/min. After the perforating, the polymer (polymethyl methacrylate) of methyl methacrylate was dissolved by means of a Soxhlet extractor using methyl ethyl ketone as a solvent to remove it by extraction.

The perforations in the perforated sheet obtained in such a manner were observed through a microscope. As a result, it was found that peripheries of the perforations were not collapsed like Example 1, and the inner wall surfaces of the perforations also had a surface cut along a punch hole. Neither deformation nor burr was observed at peripheries of the perforations, and the microstructure of the peripheries of the perforations also retained the same form as other portions than the perforated portions.

Example 9

To 100 g of methyl methacrylate (LIGHT-ESTER M, product of KYOEISHA CHEMICAL Co., LTD.) was added 0.2 g of IRGACURE 184 (product of Wako Pure Chemical Industries, Ltd.) as a photopolymerization initiator, and the resultant mixture was stirred. The same expanded PTFE sheet as that used in Example 1 was provided and impregnated with the methyl methacrylate solution.

The expanded PTFE sheet thus treated was then irradiated with ultraviolet rays at 50 mW/cm$^2$ for 10 minutes by means of a high pressure mercury lamp to photopolymerize methyl methacrylate. After perforations were formed in the same manner as in Example 8, the polymer was extracted and removed with a solvent.

The perforations in the perforated sheet obtained in such a manner were observed through a microscope. As a result, it was found that peripheries of the perforations were not collapsed like Example 1, and the inner wall surfaces of the perforations also had a surface cut along a punch hole. Neither deformation nor burr was observed at peripheries of the perforations, and the microstructure of the peripheries of the perforations also retained the same form as other portions than the perforated portions.

Example 10

Twenty grams of polymethyl methacrylate (SUMIPEX LG35, product of Sumitomo Chemical, Co., Ltd) was dissolved in 80 g of methyl methacrylate (LIGHT-ESTER M, product of KYOEISHA CHEMICAL Co., LTD.) under conditions of 40° C. for 12 hours, 0.2 g of IRGACURE 184 (product of Wako Pure Chemical Industries, Ltd.) was added as a photo-polymerization initiator, and the resultant mixture was stirred. The same expanded PTFE sheet as that used in Example 1 was provided and impregnated with the methyl methacrylate solution.

The expanded PTFE sheet thus treated was then irradiated with ultraviolet rays at 50 mW/cm$^2$ for 10 minutes by means of a high pressure mercury lamp to photopolymerize methyl methacrylate. After perforations were formed in the same manner as in Example 8, the polymer was extracted and removed with a solvent.

The perforations in the perforated sheet obtained in such a manner were observed through a microscope. As a result, it was found that peripheries of the perforations were not collapsed like Example 1, and the inner wall surfaces of the perforations also had a surface cut along a punch hole. Neither deformation nor burr was observed at peripheries of the perforations, and the microstructure of the peripheries of the perforations also retained the same form as other portions than the perforated portions.

Example 11

Three expanded PTFE sheets each having an area of 10 cm$^2$, a porosity of 60%, an average pore diameter of 0.1 μm (bubble point with isopropyl alcohol: 150 kPa) and a thickness of 30 μm were superimposed on one another and held between 2 stainless steel plates each having dimensions of 3 mm in thickness, 150 mm in length and 100 mm in width. A load of the stainless steel plates was applied to the sheets, and a heat treatment was conducted at 350° C. for 30 minutes. After the heating, the sheets were quenched with water from above the stainless steel plates to obtain a laminate with the 3 layers of the expanded PTFE sheets fusion-bonded to one another.

To 100 g of methyl methacrylate (LIGHT-ESTER M, product of KYOEISHA CHEMICAL Co., LTD.) was added 0.2 g of azobisisobutyronitrile (product of Wako Pure Chemical Industries, Ltd.) as a heat polymerization initiator, and the resultant mixture was stirred. The laminate prepared above was impregnated with the methyl methacrylate solution. The laminate impregnated with the methyl methacrylate solution was heated at 80° C. for 4 hours on a hot plate to heat-polymerize methyl methacrylate.

After the polymerization, the laminate was perforated by means of a combination of a punch and a die, which forms through-holes having a diameter of 250 μm. A perforating rate was 100 holes/min. After the perforating, the polymer (polymethyl methacrylate) of methyl methacrylate was dissolved by means of a Soxhlet extractor using methyl ethyl ketone as a solvent to remove it by extraction.

After the laminate was dipped for 1 minute in ethanol to hydrophilize it, the laminate was dipped for 4 minutes at a temperature of 60° C. in Melplate PC-321 produced by Meltex Inc., which was diluted to 100 ml/L, to conduct conditioning. After the laminate was further dipped for 1 minute in 10% sulfuric acid, it was dipped for 2 minutes in a solution with Enplate PC-236 produced by Meltex Inc. dissolved in a proportion of 180 g/L in 0.8% hydrochloric acid as predipping.

The laminate was dipped for 5 minutes in a solution with Enplate PC-236 produced by Meltex Inc. dissolved in a proportion of 150 g/L in an aqueous solution of 3% Enplate Activator 444 produced by Meltex Inc., 1% Enplate Activator Additive and 3% hydrochloric acid to apply tin-palladium colloid particles to the surfaces and wall surfaces of the through-holes of the laminate. The laminate thus treated was then dipped in a liquid obtained by diluting PA-360 produced by Meltex Inc. in a proportion of 50 ml/L with purified water to dissolve tin, thereby activating the catalyst. Thereafter, the mask layers on both surfaces were separated to obtain an expanded PTFE sheet (base film) with the catalyst palladium particles applied only to the wall surfaces of the through-holes.

The thus-obtained base film was immersed for 20 minutes in an electroless copper plating solution prepared with each 5% of Melplate Cu-3000A, Melplate Cu-3000B, Melplate Cu-3000C and Melplate Cu-3000D, and 1% of Melplate Cu-3000 Stabilizer, which were all products of Meltex Inc., while sufficiently conducting air stirring, thereby making only the wall surfaces of the perforations conductive with copper particles. The base film was further dipped for 30 seconds in Entech Cu-56 produced by Meltex Inc., which was prepared at 5 ml/L to subject the copper particles to a rust-preventing treatment, thereby obtaining an anisotropically conductive sheet comprising the expanded PTFE sheet as a base film.

In the plating process, water washing with purified water was conducted for about 30 seconds to 1 minute after the respective dipping steps other than the dipping between the predipping step and the catalyst-applying step of the electroless copper plating. The respective steps were all conducted at ordinary temperature (20 to 30° C.) except for the conditioning.

The anisotropically conductive sheet comprising the expanded PTFE sheet obtained in the above-described manner as a base film was cut into 10 mm square, and a conduction-starting load of the cut sheet was measured by means of the apparatus shown in FIG. 5. A copper rod having a diameter of 3 mm was used as a probe, and the probe was brought into contact with an electrode to measure a resistance value by the four probe method. As a result, the resistance value was 3.5Ω under a pressing load of 5.0 MPa.

INDUSTRIAL APPLICABILITY

According to the present invention, there are provided porous resin bases, in which perforations having smooth and sharp edges and a uniform opening diameter have been formed at necessary positions thereof without incurring collapse of the porous structure at peripheral portions of the perforations, including the inner wall surfaces thereof and also without producing burr.

The perforated porous resin bases obtained by the production processes of the present invention are useful as, for example, insulating bases of materials for connection between circuits and anisotropically conductive materials, and further can be used in a wide variety of fields including medical devices such as patch repairing materials, and separation membranes.

In addition, according to the present invention, the soluble polymer or paraffin is used as a masking material for limiting conductive portions provided in the porous resin base, whereby the mask layers coming into highly close contact with the base can be formed, and it can be easily removed after the masking. When the soluble polymer or paraffin is impregnated into the porous structure, and perforations are formed by a machine-working method after the polymer or paraffin is turned into a solid state, the perforations can be formed with high precision without collapsing the porous structure. This process may also be carried out by using a compound capable of forming a solid substance by a chemical reaction, such as a polymerizable monomer.

Further, according to the present invention, only the inner wall surfaces of the perforations may also be made conductive by a process comprising arranging porous resin layers as mask layers on both surfaces of the porous resin base to prepare a laminate, impregnating the laminate with the soluble polymer or paraffin or the compound capable forming a solid substance by a chemical reaction, and forming the solid substance.

According to the production processes of the present invention, the perforations can be formed without collapsing the porous structure, so that plating particles composed of a conductive metal can be applied to the inner wall surfaces of the perforations so as to be entangled in a resin portion forming the porous structure even when the porous resin base is formed with a fluorocarbon resin material poor in plate adhesion.

The perforated porous resin bases obtained by the production processes according to the present invention can be utilized in a wide variety of fields of, for example, materials for connection between circuits, anisotropically conductive materials and insulating materials in an electronic field; medical devices such as patch repairing materials in a medical field; and separation membranes.

The porous resin bases with the inner wall surfaces of the perforations made conductive, which are obtained by the production processes according to the present invention, can be used in, for example, electrical connection between circuit devices in semiconductor devices; and tests for electrical reliability, which are carried out in circuit boards, semiconductor wafers and semiconductor packages.

The invention claimed is:

1. A process for producing a perforated porous resin base, which comprises the following Steps 1 to 4:
    Step 1 of impregnating the porous structure of a porous resin base with a liquid or a solution;
    Step 2 of forming a solid substance from the liquid or the solution impregnated;
    Step 3 of forming a plurality of perforations extending through from the first surface of the porous resin base having the solid substance within the porous structure to the second surface in the porous resin base; and
    Step 4 of melting or dissolving the solid substance to remove it from the interior of the porous structure,
    wherein the porous resin base is a porous resin base which is an expanded polytetrafluoroethylene base having a microstructure comprising fibrils and nodes connected to each other by the fibrils,
    wherein the liquid used in Step 1 is either a substance having a solidifying point or a melting point within a range of from −150 to 150° C. which is water, an alcohol, a hydrocarbon, a polymer or a mixture of two or more compounds thereof, or a liquid containing a compound capable of forming a solid substance by a chemical reaction,
    wherein the solution used in Step 1 is a solution containing a soluble polymer, which is in a solid state at a temperature ranging from 15 to 30° C., and a solvent, a solution containing paraffin, which is in a solid state at a temperature ranging from 15 to 30° C., and a solvent, or a solution containing a compound capable of forming a solid substance by a chemical reaction and a solvent,
    wherein the compound capable of forming a solid substance by a chemical reaction is a polymerizable monomer undergoing a polymerization reaction by heat or light to form a polymer, and
    wherein the plurality of perforations is formed by a mechanically perforating method or a method of etching by a light abrasion method.

2. The production process according to claim 1, wherein in Step 1, the liquid or the solution is impregnated into the porous structure of the porous resin base by a casting or dipping method.

3. The production process according to claim 1, wherein the substance having a solidifying point or a melting point within the range of from −150 to 150° C. is impregnated as a liquid at a temperature exceeding the solidifying point or the melting point thereof into the porous structure of the porous resin base in Step 1, the solid substance is solidified at a temperature not higher than the solidifying point or the melting point to form a solid substance in Step 2, and this substance is melted at a temperature exceeding the solidifying point or the melting point to remove it in Step 4.

4. The production process according to claim 1, wherein the liquid containing the polymerizable monomer undergoing a polymerization reaction by heat or light to form a polymer or the solution containing the polymerizable monomer undergoing a polymerization reaction by heat or light to form a polymer and a solvent is a liquid or a solution also containing, in addition to the polymerizable monomer, a polymer obtained by the polymerization of the polymerizable monomer.

5. The production process according to claim 1, wherein the polymerizable monomer is an acrylate or a methacrylate.

6. The production process according to claim 1, wherein the substance having a solidifying point or a melting point within a range of from −150 to 150° C. is paraffin having a melting point of at least 15° C.

7. The production process according to claim 1, wherein the solution containing a soluble polymer and a solvent, or the solution containing paraffin and a solvent is impregnated into the porous structure of the porous resin base in Step 1, the solvent is vaporized out to form a solid substance of the polymer or the paraffin in Step 2, and the solid substance is dissolved with a solvent to remove it in Step 4.

8. A process for producing a porous resin base with the inner wall surfaces of perforations made conductive, which comprises the following Steps I to VI:
   Step I of impregnating the porous structure of a porous resin base including both surfaces thereof with a solution or a liquid;
   Step II of forming a solid substance from the solution or the liquid, which has been impregnated, to form a composite sheet of a structure that both surfaces of the porous resin base have a layer of the solid substance, and the solid substance is impregnated into the porous structure;
   Step III of forming a plurality of perforations extending through from the first surface of the composite sheet to the second surface in the composite sheet;
   Step IV of applying a catalyst facilitating a reducing reaction of a metal ion to the surfaces of the composite sheet including the inner wall surfaces of the respective perforations;
   Step V of removing the solid substance from the composite sheet; and
   Step VI of using the catalyst applied to and remaining on the inner wall surfaces of the respective perforations in the porous resin base to apply a conductive metal to the inner wall surfaces,
   wherein the porous resin base is a porous resin base which is an expanded polytetrafluoroethylene base having a microstructure comprising fibrils and nodes connected to each other by the fibrils,
   wherein the solution is a solution containing a soluble polymer and a solvent, a solution containing paraffin and a solvent, or a solution containing a compound capable of forming a solid substance by a chemical reaction and a solvent,
   wherein the liquid is a melt of a soluble polymer, a melt of paraffin, or a compound capable of forming a solid substance by a chemical reaction,
   wherein the soluble polymer or the paraffin is in a solid state at a temperature ranging from 15 to 30° C.,
   wherein the compound capable of forming a solid substance by a chemical reaction is a polymerizable monomer undergoing a polymerization reaction by heat or light to form a polymer, and
   wherein the plurality of perforations is formed by a mechanically perforating method or a method of etching by a light-abrasion method.

9. The production process according to claim 8, wherein in Step I, the solution containing a soluble polymer and a solvent, or the solution containing paraffin and a solvent, or the melt of paraffin is impregnated by a method of casting the solution or the melt on both surfaces of the porous resin base or dipping the porous resin base in the solution or the melt, and in Step II, a composite sheet of the structure that both surfaces of the porous resin base have a solid layer of the soluble polymer or the paraffin, and the solid soluble polymer or the solid paraffin is impregnated into the porous structure is formed by a method of vaporizing out the solvent or lowering the temperature of the porous resin base to a temperature not higher than a solidifying point or melting point of the soluble polymer or the paraffin.

10. The production process according to claim 8, wherein in Step I, the liquid of a polymerizable monomer undergoing a polymerization reaction by heat or light to form a polymer, or the solution containing a polymerizable monomer undergoing a polymerization reaction by heat or light to form a polymer and a solvent is impregnated by a method of casting the liquid or the solution on both surfaces of the porous resin base or dipping the porous resin base in the liquid or the solution and in Step II, the composite sheet of the structure that both surfaces of the porous resin base have a solid polymer layer, and the solid polymer is impregnated into the porous structure is formed by a method of polymerizing the polymerizable monomer by heat or light to form a solid polymer.

11. The production process according to claim 8, wherein in Step V, the solid substance is dissolved and removed by using a solvent that does not dissolve or hardly dissolves the porous resin base, but exhibits good solubility for the solid substance.

12. The production process according to claim 8, wherein in Step IV, the solid substance is melted and removed.

13. The production process according to claim 8, wherein in Step VI, the conductive metal is applied to the inner wall surfaces of the respective perforations by electroless plating.

14. The production process according to claim 8, wherein the porous resin base with the inner wall surfaces of the perforations made conductive is an anisotropically conductive sheet that has conductive portions formed by the conductive metal applied to the resin portion of the porous structure in the inner wall surfaces of the plurality of the perforations extending through from the first surface to the second surface and permits imparting conductivity only to the thickness-wise direction of the sheet by the conductive portions.

15. A process for producing a porous resin base with the inner wall surfaces of perforations made conductive, which comprises the following Steps i to viii:
   Step i of laminating, as mask layers, porous resin layers (B) and (C) on both surfaces of a porous resin base (A) to form a laminate of a 3-layer structure;
   Step ii of impregnating the respective porous structures of the laminate with a solution or a liquid;
   Step iii of forming a solid substance from the solution or the liquid, which has been impregnated;
   Step iv of forming a plurality of perforations extending through from the first surface of the laminate having the solid substance within the respective porous structures to the second surface in the laminate;
   Step v of dissolving the solid substance to remove it from the interiors of the respective porous structures;
   Step vi of applying a catalyst facilitating a reducing reaction of a metal ion to the surfaces of the laminate including the inner wall surfaces of the respective perforations;
   Step vii of removing the mask layers from both surfaces of the porous resin base (A); and
   Step viii of using the catalyst applied to and remaining on the inner wall surfaces of the respective perforations in the porous resin base (A) to apply a conductive metal to the inner wall surfaces,
   wherein the porous resin base is a porous resin base which is an expanded polytetrafluoroethylene base having a microstructure comprising fibrils and nodes connected to each other by the fibrils,
   wherein the solution is a solution containing a soluble polymer and a solvent, a solution containing paraffin and a solvent, or a solution containing a compound capable of forming a solid substance by a chemical reaction and a solvent,
   wherein the liquid is a melt of a soluble polymer, a melt of paraffin, or a compound capable of forming a solid substance by a chemical reaction,
   wherein the soluble polymer or the paraffin is in a solid state at a temperature ranging from 15 to 30° C., wherein the compound capable of forming a solid substance by a chemical reaction is a polymerizable monomer undergoing a polymerization reaction by heat or light to form a polymer, and wherein the plurality of perforations is formed by a mechanically perforating method or a method of etching by a light-abrasion method.

16. The production process according to claim 15, wherein the liquid containing the polymerizable monomer undergoing a polymerization reaction by heat or light to form a polymer or the solution containing the polymerizable monomer undergoing a polymerization reaction by heat or light to form a polymer and a solvent is a liquid or solution also containing, in addition to the polymerizable monomer, a polymer obtained by the polymerization of the polymerizable monomer.

17. The production process according to claim 15, wherein the polymerizable monomer is an acrylate or a methacrylate.

18. The production process according to claim 15, wherein in Step ii, the solution containing a soluble polymer and a solvent, or the solution containing paraffin and a solvent, or the melt of a soluble polymer, or the melt of paraffin is impregnated by casting the solution or the on both surfaces of the laminate or dipping the laminate in the solution or the melt, and in Step iii, a solid polymer or a solid paraffin is formed by a method of vaporizing out the solvent or lowering the temperature of the laminate to a temperature not higher than a solidifying point or a melting point of the soluble polymer or the paraffin.

19. The production process according to claim 15, wherein in Step ii, the liquid of a polymerizable monomer undergoing a polymerization reaction by heat or light to form a polymer, or the solution containing the polymerizable monomer undergoing a polymerization reaction by heat or light to form a polymer and a solvent is impregnated into the respective porous structures of the laminate, and in Step iii, the polymerizable monomer is polymerized by heat or light to form a solid polymer.

20. The production process according to claim 15, wherein in Step v, the solid substance is dissolved and removed by using a solvent that does not dissolve or hardly dissolves the porous resin base, but exhibits good solubility for the solid substance.

21. The production process according to claim 15, wherein in Step viii, the conductive metal is applied to the inner wall surfaces of the respective perforations by electroless plating.

22. The production process according to claim 15, wherein the porous resin base with the inner wall surfaces of the perforations made conductive is an anisotropically conductive sheet that has conductive portions formed by the conductive metal applied to the resin portion of the porous structure in the inner wall surfaces of the plurality of the perforations extending through from the first surface to the second surface and permits imparting conductivity only to the thicknesswise direction of the sheet by the conductive portions.

* * * * *